United States Patent [19]

Arai et al.

[11] Patent Number: 4,908,330
[45] Date of Patent: Mar. 13, 1990

[54] PROCESS FOR THE FORMATION OF A FUNCTIONAL DEPOSITED FILM CONTAINING GROUP IV ATOMS OR SILICON ATOMS AND GROUP IV ATOMS BY MICROWAVE PLASMA CHEMICAL VAPOR DEPOSITION PROCESS

[75] Inventors: Takayoshi Arai, Nagahama; Masahiro Kanai, Tokyo; Soichiro Kawakami; Tsutomu Murakami, both of Nagahama, all of Japan

[73] Assignee: Canon Kabushiki Kaisha, Tokyo, Japan

[21] Appl. No.: 302,245

[22] Filed: Jan. 27, 1989

[30] Foreign Application Priority Data

Feb. 1, 1988 [JP] Japan .................................. 63-21798
Feb. 1, 1988 [JP] Japan .................................. 63-21799

[51] Int. Cl.$^4$ ............................................ H01L 21/14
[52] U.S. Cl. .............................. 437/170; 148/DIG. 1; 437/3; 437/937
[58] Field of Search ................. 148/DIG. 1, 6, 22, 45, 148/64, 79, 110, 122, 153, 169; 427/38, 39; 156/610–614; 437/2–5, 18, 81, 101, 87, 170–172, 914, 916, 937

[56] References Cited

U.S. PATENT DOCUMENTS

| | | | |
|---|---|---|---|
| 4,401,054 | 8/1983 | Matsuo et al. | 118/50.1 |
| 4,421,592 | 12/1983 | Shuskuo et al. | 156/613 |
| 4,566,403 | 1/1986 | Fournier | 118/718 |
| 4,657,777 | 4/1987 | Hirooka et al. | 427/39 |
| 4,673,589 | 6/1987 | Standley | 427/41 |
| 4,676,195 | 6/1987 | Yasui et al. | 427/39 |
| 4,798,167 | 1/1989 | Ishihara et al. | 118/723 |
| 4,832,778 | 5/1989 | Davis et al. | 118/728 |
| 4,837,113 | 6/1989 | Luttmer et al. | 427/38 |

FOREIGN PATENT DOCUMENTS

| | | |
|---|---|---|
| 0071369 | 4/1983 | Japan . |
| 0063376 | 4/1985 | Japan . |
| 0202438 | 9/1986 | Japan . |
| 0276977 | 12/1986 | Japan . |
| 0077479 | 4/1987 | Japan . |
| 0116775 | 5/1987 | Japan . |
| 0150709 | 7/1987 | Japan . |

Primary Examiner—Brian E. Hearn
Assistant Examiner—William Bunch
Attorney, Agent, or Firm—Fitzpatrick, Cella, Harper & Scinto

[57] ABSTRACT

A process for the formation of a functional deposited film as a thin semiconductor film constituted with the group IV element or a thin semiconductor film constituted with group IV element alloy, by introducing, into a film forming space, a compound as the film-forming raw material and, if required, a compound containing an element capable of controlling valence electrons for the deposited film as the constituent element each in a gaseous state, or in a state where at least one of the compounds is activated, while forming hydrogen atoms in an excited state causing chemical reaction with at least one of the compounds in the gaseous state or in the activated state in an activation space different from the film forming space and introducing them into the film forming space, thereby forming a deposited film on a substrate, wherein the hydrogen atoms in the excited state are formed from a hydrogen gas or a gas mixture composed of a hydrogen gas and a rare gas by means of a microwave plasma generated in a plasma generation chamber disposed in a cavity resonator integrated with two impedance matching circuits in a microwave circuit and the excited state of the hydrogen atoms is controlled.

20 Claims, 11 Drawing Sheets

RATIO OF INCREASE IN THE DIAMETER
OF THE GAS LIBERATION HOLE OF THE
GAS LIBERATION RING(%)

RATIO OF DECREASE IN THE DIAMETER
OF THE GAS LIBERATION HOLE OF THE
GAS LIBERATION RING(%)

PROCESS FOR THE FORMATION OF A FUNCTIONAL DEPOSITED FILM CONTAINING GROUP IV ATOMS OR SILICON ATOMS AND GROUP IV ATOMS BY MICROWAVE PLASMA CHEMICAL VAPOR DEPOSITION PROCESS

FIELD OF THE INVENTION

The present invention relates to an improved process for forming a functional deposited film containing group IV atoms as the main constituent atoms or a functional deposited film containing silicon atoms and group IV atoms as the main constituent atoms, which is usable especially as a photoconductive member for semiconductor devices, photosensitive devices for use in electrophotography, image input line sensors, image pickup devices, photoelectromotive force devices or the like.

More specifically, the present invention relates to an improved process for efficiently forming a functional deposited film on a substrate by forming excited hydrogen atoms in excited state by using a hydrogen gas or a gas mixture composed of a hydrogen gas and a rare gas with microwave plasmas generated in a plasma generation chamber disposed in a cavity resonator integrated with two impedance matching circuits in a microwave circuit and bringing said hydrogen atoms in excited state into contact with a film-forming raw material gas or a separately activated film-forming raw material gas in a film forming chamber and thereby causing chemical reaction while controlling for the excited state of the hydrogen atoms.

BACKGROUND OF THE INVENTION

For the formation of a functional deposited film, particularly a semiconductor deposited thin film, there has been a suitable film-forming process with due regards to electrical and physical properties required therefor and also to its application use.

For example, there have been attempted plasma CVD process, reactive sputtering process, ion plating process, optical CVD process, thermal-induced CVD process, MO CVD process, MBE process, etc. and several of which have been employed and put to industrial use as being suitable for the formation of a desired semiconductor device.

However, even in the case of the plasma CVD process which has been employed most popularly, the electrical and physical properties of a resulting deposited film are not quite satisfactory in view of the preparation of a desired semiconductor device, and it sometime lacks in the plasma stability and reproducibility upon forming the deposited film and in addition, it may sometime cause a remarkable reduction in the production yield.

For overcoming these problems, there has been proposed, for example, by Japanese Patent Laid-open Sho 60-41047, a process for increasing the film deposition rate thereby remarkably improving the productivity of the film upon depositing to form a group IV semiconductor film of high quality by HR-CFVD process (hydrogen Radical Assisted CVD process).

Further, as means for forming a high density plasma efficiently by using microwaves of about 2.45 GHz, a method for arranging electromagnets around a cavity resonator thereby establishing conditions for ECR (electron cyclotron resonance) has been proposed, for example, by Japanese Patent Laid-open Sho 55-141729 and Sho 57-133636, as well as formation of various kinds of semiconductor thin films by utilizing the high density plasma has also been reported in academic conferences, etc.

By the way, in the HR-CVD process described above, although the hydrogen atoms in excited state (hydrogen radicals) have an important role for the formation of a deposited film regarding the control of the film property and the uniformity, there has been made no sufficient study for controlling the excited state of the hydrogen atoms in a great amount and uniformly upon forming the deposited film and controlling the chemical reaction upon forming the deposited film under the control of the excited state, thereby optionally and stably controlling the property of the deposited film formed, and there are still left several problems to be solved.

On the other hand, in the microwave plasma CVD apparatus using ECR, there are several problems. That is: the pressure in a plasma generation chamber has to be kept to less than about $10^{-3}$ Torr for establishing ECR conditions thus undergoing restriction for the pressure upon forming the deposited film: the mean free path of gaseous molecules is increased ($\sim 1$ m) under such a level of pressure, by which the film-forming raw material gas is diffused near the microwave introduction window, decomposed and reacted to thereby cause adherence of the deposited film to the microwave introduction window or to the inner wall of the cavity resonator, thereby making electric discharge instable: and the film to the substrate is contaminated by the defoliation and the scattering of the adhered film. Further, it has also been pointed out several problems. That is, a plasma generated in the plasma generation chamber is diversed along the diversing magnetic field of the electromagnets into the film forming chamber, by which the substrate is exposed to the plasma at relatively high density. Accordingly, the formed deposited film is liable to be damaged by charged particles, etc. and this causes limitation in the improvement of properties of a film to be formed. In the step of laminating deposited films in the process of preparing a semiconductor device, the boundary characteristic is apt to reduce because of damages caused by the charged particles, etc. and this makes it difficult to improve the characteristics of the semiconductor device.

SUMMARY OF THE INVENTION

The main object of the present invention is to overcome the foregoing various problems in the prior art process for forming a deposited film and provide a process for forming a desired functional deposited film comprising group IV atoms of the periodical table as the main constituent atoms or a desired functional deposited film comprising silicon atoms and said group IV atoms as the main constituent atoms, having a large area, with satisfactory uniformity, stably and at good reproducibility, which is effective for preparing a semiconductor device of high quality.

The present inventors have made earnest studies for overcoming the foregoing various problems in the prior art process for forming a deposited film for attaining the objects of the present invention and, as a result, have obtained a knowledge that hydrogen atoms in an optional excited state can be supplied stably, with good reproducibility and efficiently by disposing a plasma generation chamber in a cavity resonator integrated with two impedance matching circuits in a microwave circuit and conducting microwave plasma discharge by using a hydrogen gas or a gas mixture composed of a hydrogen gas and a rare gas.

The present invention has been accomplished as a result of further studies based on the above-mentioned knowledge and it includes the following two embodiments.

That is, the first embodiment according to the present invention (hereinafter referred to as "first invention") concerns a process for the formation of a functional deposited film containing atoms belonging to the group IV of the periodical table as the main constituent atoms by introducing, into a film forming space for forming a deposited film on a substrate disposed therein, a compound containing an element belonging to the group IV of the periodical table as the film-forming raw material and, if required, a compound containing an element capable of controlling valence electrons for the deposited film as the constituent element, each in a gaseous state, or in a state where at least one of the compounds is previously activated in an activation space disposed separately from the film forming space, while forming hydrogen atoms in an excited state which cause chemical reaction with at least one of the compounds in the gaseous state or in the activated state in an activation space different from the film forming space and introducing them into the film forming space, thereby forming the deposited film on the substrate, wherein the hydrogen atoms in the excited state are formed from a hydrogen gas or a gas mixture composed of a hydrogen gas and a rare gas by means of a microwave plasma generated in a plasma generation chamber disposed in a cavity resonator integrated with two impedance matching circuits in a microwave circuit and the excited state of the hydrogen atoms is controlled.

The second embodiment according to the present invention (hereinafter referred to as "second invention") relates to a process for the formation of a functional deposited film containing the group IV atoms and silicon atoms as the main constituent atoms and the feature of this process is as described below.

That is, the second invention relates to a process for the formation of a deposited film, by introducing, into a film forming space for forming a deposited film on a substrate disposed therein, a compound (1) containing silicon and a compound (2) represented by the following general formula (I) as the film-forming raw material and, if required, a compound (3) containing an element capable of controlling valence electrons for the deposited film as the constituent element each in a gaseous state or in a state where at least one of the compounds (1), (2) and (3) is previously activated in an activation space disposed separately from the film forming space, while forming hydrogen atoms in excited state which cause chemical reaction with at least one of the compounds in the gaseous state or in the activated state in an activation space different from the film forming space and introducing them into the film-forming space, thereby forming the deposited film on the substrate disposed therein, wherein the hydrogen atoms in the excited state are formed from a hydrogen gas or a gas mixture of a hydrogen gas and a rare gas by means of a microwave plasma generated in a plasma generation chamber disposed in a cavity resonator integrated with two impedance matching circuits in a microwave circuit and the excited state of the hydrogen atoms is controlled:

$$A_aB_b \quad (I)$$

where A represents an element other than silicon among those elements belonging to the group IV of the periodical table, B represents a member selected from hydrogen (H), halogen (X) and hydrocarbon group, a represents a positive integer equal to or multiple integer of the valence number for B and b represents a positive integer.

According to the present invention, a functional deposited film containing group IV atoms as the main constituent atoms and a functional deposited film containing silicon atoms and group IV atoms as the main constituent atoms and having uniform film quality, uniform film thickness, various excellent properties and high film quality can be formed at a remarkably improved film forming rate, stably, with good reproducibility and efficiently.

Further, according to the present invention, the productivity can be improved remarkably in either of the processes for forming the functional deposited film and the effective mass production of the functional deposited film can be attained as compared with the conventional methods.

Furthermore, according to the present invention, the temperature for the substrate on which a deposited film to be formed can be lowered as compared with that in the prior art method, as well as the film quality can be controlled easily, stably and with good reproducibility by controlling the excited state of the hydrogen atoms, the amount of the film-forming raw material gases introduced, etc.

DETAILED DESCRIPTION OF THE INVENTION

Figure 1:
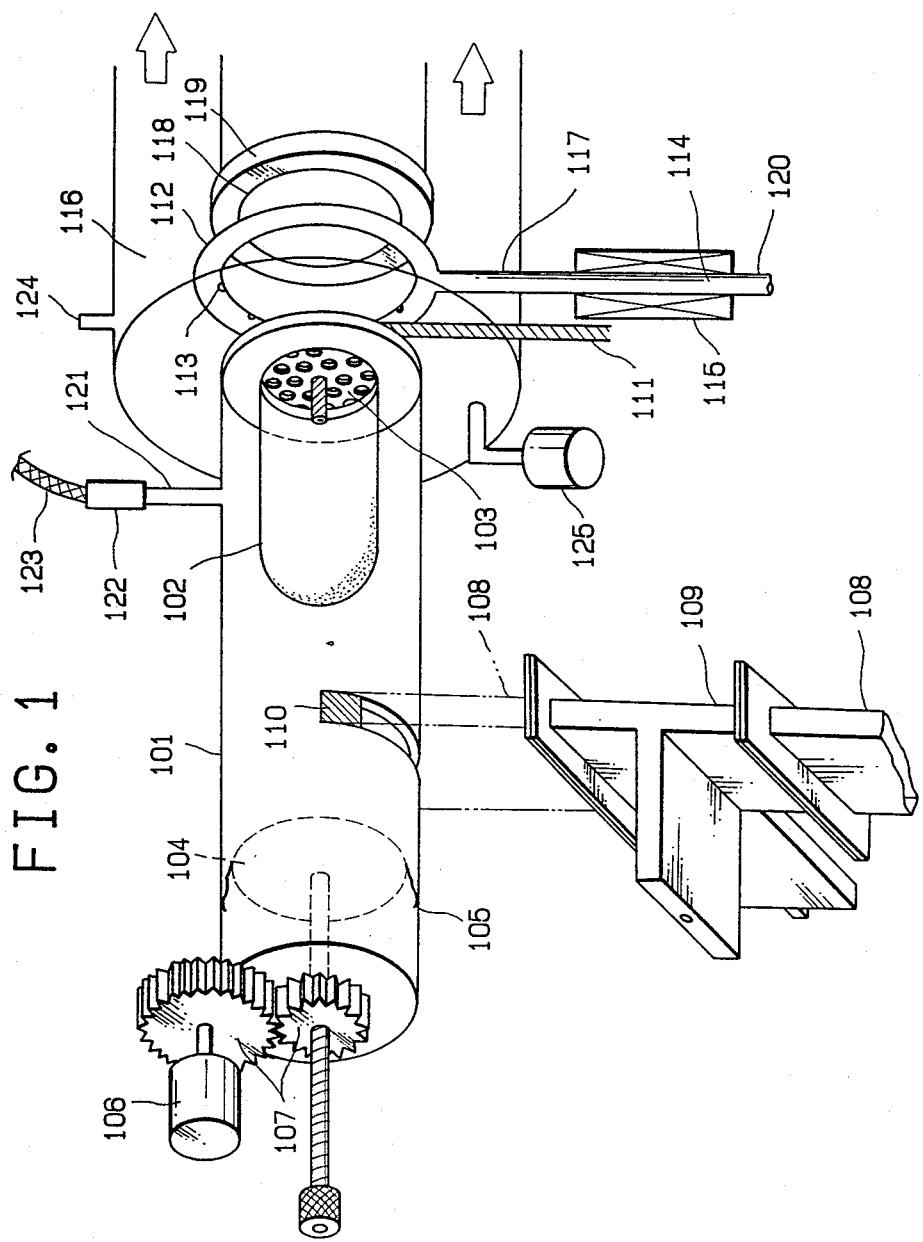
FIG. 1 is a perspective view schematically illustrating a constitutional example of the apparatus suitable for practicing a process for forming a functional deposited film by a micrwwave plasma CVD process according to the present invention.

In the present invention, control for the excited state of the hydrogen atoms is attained b measuring emission intensity of $H_\alpha$ and $H_\beta$ as the excited state of hydrogen by emission spectrophotometry and controlling one or more of the microwave power charged to a cavity resonator, the impedance matching condition, the hydrogen gas flow rate or the flow rate of the gas mixture composed of hydrogen gas and rare gas and the total pressure.

The impedance matching circuit in the cavity resonator integrated with two impedance matching circuits in the microwave circuit is a restriction body disposed to a cavity length varying plunger and to a junction portion between a microwave waveguide tube and a cavity resonator, and the condition for the impedance matching is controlled by adjusting such restrictions bodies.

The impedance matching circuit may be a cavity length varying plunger and an E-H tuner or a three-stub tuner.

Further, the plasma generation chamber is constituted with a metal mesh member and a microwave permeable bell jar and connected by way of the metal mesh member to the film forming space, and the hydrogen atoms in excited state are introduced through the metal mesh member into the film forming space.

On the other hand, a substrate is disposed at an angle of 30° or less relative to the horizontal axis of the metal mesh surface and at a distance within 100 mm from the metal mesh surface. The compound in the gaseous state or activated state is introduced into the film forming space by way of gas liberation means disposed between the metal mesh surface and the substrate.

The gas liberation means are disposed so as to surround, in an annular configuration, the substrate and the amount of gases liberated from each of the gas liberation apertures is made uniform, by gradually decreasing the interval of the gas liberation apertures from the side of introducing the gas liberation means toward the final liberation aperture, by gradually enlarging the size of the gas liberation aperture from the side of introducing the gas liberation means toward the final liberation aperture or by uniformly distributing the gas liberation apertures at least in the plane of the substrate and gradually enlarging the size for each of the gas liberation apertures from the side of introducing the gas liberation means toward the central portion.

When a desired functional deposited film is formed by the process according to the present invention, a compound containing the group IV element or the compounds (1) and (2) described above and, if required, a compound containing an element capable of controlling valence electrons for the deposited film as the constituent element and, separately, hydrogen atoms controlled for the excited state thereof are introduced in a gaseous state or activated state into the film forming chamber to cause chemical reactions among them, thereby forming a group IV semiconductor thin film or a group IV series semiconductor thin film is formed on the substrate. In this case, the crystallinity, hydrogen content, etc. of any of the said semiconductor thin films can be controlled stably with good reproducibility.

The excited state of the atomic hydrogen in the present invention is determined from light emission observed in a microwave plasma of a hydrogen gas or a gas mixture of a hydrogen gas and a rare gas. Specifically, light emission from the microwave plasma is measured by emission spectrophotometry and the excited state is determined by the intensity ratio for the emission line at 656 nm belonging to H and at 486 nm belonging to $H_\beta$ among the emission lines of atomic hydrogens (H*), and at least one of the parameters, i.e., the microwave power charged to the cavity resonator, the impedance matching condition, the hydrogen gas flow rate or the flow rate of the gas mixture composed of hydrogen gas and rare gas and the total pressure is controlled so as to attain the aimed intensity ratio.

In the present invention, it is preferred to control the intensity ratio of $H/H_\beta$ to preferably, a range of from 1/1 to 1000/1, more preferably, a range of from 10/1 to 500/1 in controlling the excited state of the hydrogen atoms.

Within the range of the intensity ratio as described above, combination of the kind and the temperature of the substrate is, particularly, a determinative factor for the film quality, etc. and a deposited film of desired quality and property can be formed by properly combining them. Accordingly, it is necessary in the present invention to employ an emission spectrophotometer having such a sensitivity as capable of measuring the intensity ratio described above.

In the present invention, since the monitor for the microwave plasma is situated at a position, relative to the flowing direction of the total gas, to the upstream of the gas liberation means for the compound containing the group IV element or the compounds (1) and (2), no substantial deposited film is formed thereon and stable monitoring is possible from the start to the end of the film formation.

As the compound containing the group IV element used in the first invention, it is preferred to select those spontaneously producing chemical species that cause molecular collision with the hydrogen atoms in excited state and take place chemical reaction thereby contributing to the formation of a deposited film on the substrate. If they are not desirably reactive with the hydrogen atoms in excited state or have not high activity in the usual state of their existence, it is necessary to excite the compound of the group IV element to such a state as capable of causing chemical reaction with the hydrogen atoms in excited state, by applying such an excitation energy as not completely dessociating the group IV element before and during film formation, thereby bringing the compound of the group IV element into such an excited state as capable of causing chemical reaction with the hydrogen atoms in excited state. The compound that can form such an excited state is employed as one of the compounds usable in the process according to the present invention.

In the first invention, as the compound containing the group IV element, there can be used, specifically, those having highly electron attracting atoms, atom groups or polar groups bonded to carbon atom, silicon atom or germanium atom. There can be used, for example, those compounds containing silicon and halogen such as linear or cyclic silane compounds in which hydrogen atoms are partially or entirely substituted with halogen atoms. As specific examples, there can be mentioned: a linear silicon halide represented by the formula: $Si_uY_{2u+2}$, where u represents an integer of 1 or greater and Y represents at least one element selected from F, Cl, Br and I: a cyclic silicon halide represented by the formula: $Si_vY_{2v}$, where v represents an integer of 3 or greater and Y has the same meanings as described above: and a linear or cyclic compound represented by the formula: $Si_uH_xY_y$, where u and Y have the same meanings as described above and $x+y=2u$ or $2u+2$.

Specifically, there can be mentioned, for example, $SiF_4$, $(SiF_2)_5$, $(SiF_2)_6$, $(SiF_2)_4$, $Si_2F_6$, $Si_3F_8$, $SiHF_3$, $SiH_2F_2$, $Si_2H_2F_4$, $Si_2H_3F_3$, $SiCl_4$, $(SiCl_2)_5$, $SiBr_4$, $(SiBr_2)_5$, $Si_2Cl_6$, $Si_2Br_6$, $SiHCl_3$, $SiHBr_3$, $SiHI_3$, $Si_2Cl_3F_3$, etc. in a gaseous or easily gasifiable state.

These silicon compounds may be used alone or in a combination of two or more of them.

As the compound containing carbon and halogen, those compounds in which hydrogen atoms in a linear or cyclic hydrocarbon compound are partially or entirely substituted with halogen atoms may be used. Specifically, there can be mentioned, for example, a linear carbon halide represented by the formula: $C_uY_{2u+2}$, where u represents an integer of 1 or greater and Y represents at least one element selected from F, Cl, Br and I: a cyclic carbon halide represented by the formula: $C_vY_{2v}$, where v represents an integer of 3 or greater and Y has the same meanings as described above: and a linear or cyclic compound represented by the formula: $C_uH_xY_y$, where u and Y have the same meanings as described above and $x+y=2u$ or $2u+2$.

Specifically, there can be mentioned, for example, $CF_4$, $(CF_2)_5$, $(CF_2)_6$, $(CF_2)_4$, $C_2F_6$, $C_3F_8$, $CHF_3$, $CH_2F_2$, $CCl_4$, $(CCl_2)_5$, $CBr_4$, $(CBr_2)_5$, $C_2Cl_6$, $C_2Br_6$, $CHCl_3$, $CHI_3$, $C_2Cl_3F_3$ etc. in a gaseous or easily gasifiable state.

These carbon compounds may be used alone or in a combination of two or more of them.

As the compound containing germanium and halogen, those compounds in which hydrogen atoms in a linear or cyclic hydrogenated germanium compound are partially or entirely substituted with halogen atoms may be used. Specifically, there can be mentioned, for example, a linear germanium halide represented by the formula: $Ge_uY_{2u+2}$, where u represents an integer of 1 or greater and Y represents at least one element selected from F, Cl, Br and I: a cyclic germanium halide represented by the formula: $Ge_vY_{2v}$, where v represents an integer of 3 or greater and Y has the same meanings as described above: and a linear or cyclic compound represented by the formula: $Ge_uH_xY_y$, where u and Y have the same meanings as described above and $x+y=2u$ or $2u+2$.

Specifically, there can be mentioned, for example, $GeF_4$, $(GeF_2)_5$, $(GeF_2)_6$, $(GeF_2)_4$, $Ge_2F_6$, $Ge_3F_8$, $GeHF_3$, $GeH_2F_2$, $Ge_2H_2F_4$, $Ge_2H_3F_3$, $GeCl_4$, $(GeCl_2)_5$, $GeBr_4$, $(GeBr_2)_5$, $Ge_2Cl_6$, $Ge_2Br_6$, $GeHCl_3$, $GeHBr_3$, $GeHI_3$, $Ge_2Cl_3F_3$ etc. in a gaseous or easily gasifiable state.

In the process for the first invention, as the valence electron controlling element, there can be mentioned, preferably, as a p-type impurity, those of group III elements, for example, B, Al, Ga, In, Tl, etc and, as an n-type impurity, those of group V elements, for example, N, P, As, Sb, Bi, etc. Especially, B, Ga, P and Sb are most preferred. The amount of such impurity is properly determined depending upon desired electrical and optical properties for a deposited film to be obtained.

As the raw material for introducing such impurity, those in a gaseous state under normal temperature and normal pressure and those at least capable of being easily gasified under the film forming conditions are employed. As the raw material for the introduction of such impurity, there can be mentioned, specifically, $PH_3$, $P_2H_4$, $PF_3$, $PF_5$, $PCl_3$, $AsH_3$, $AsF_3$, $AsF_5$, $AsCl_3$, $SbH_3$, $SbF_5$, $BiH_3$, $BF_3$, $BCl_3$, $BBr_3$, $B_2H_6$, $B_4H_{10}$, $B_5H_9$, $B_5H_{11}$, $B_6H_{10}$, $B_6H_{12}$, $AlCl_3$ etc.

The compound containing the impurity element may be used alone or as a combination of two or more of them.

The impurity introducing substance may be introduced into the film forming space directly in a gaseous state or after being mixed with a compound containing the group IV element, etc. or may be introduced into the film forming space after being activated in a activation space. For activating the impurity introducing substance, energy of heat, light, electric discharge, etc. can properly be selected and used as described above.

As the compounds (1) and (2), and the compound (3) containing the element capable of controlling the valence electrons for the deposited film as the constituent element used in the second invention, they are desirably selected from those causing molecular collision with the hydrogen atoms in excited state and taking place chemical reaction therewith, thereby spontaneously forming chemical species in the space where the substrate to be formed is present, thereby contributing to the formation of a deposited film to be formed on the substrate.

If they are not desirably reactive with the hydrogen atoms in excited state under the usual state of their existence or have not high activity, it is necessary to bring the compounds (1) and (2) into such an excited state as capable of causing chemical reaction with the hydrogen atoms in the excited state by providing such an extent of excitation energy as not causing complete dissociation of Si and A in the general formula described above before or during the film formation. The compound that can form such an excited state is employed as one of the compounds (1) and (2) used in the process according to the present invention.

In the second invention, as those compounds capable of being used effectively as the compound (1) and the compound (2), there can be mentioned the followings.

In the case of obtaining a group IV deposited film having semiconductive property according to the present invention, as the compound (1) containing silicon, there may be used those linear or cyclic silane compounds in which hydrogen atoms are partially or entirely substituted with halogen atoms. Specifically, there can be mentioned: a linear silicon halide represented by the formula: $Si_uY_{2u+2}$, where u represents an integer of 1 or greater and Y represents at least one element selected from F, Cl, Br and I: a cyclic silicon halide represented by the formula: $Si_vY_{2v}$, where v represents an integer of 3 or greater and Y has the same meanings as described above: and a linear or cyclic compound represented by the formula: $Si_uH_xY_y$, where u and Y have the same meanings as described above and $x+y=2u$ or $2u+2$.

Specifically, there can be mentioned, for example, $SiH_4$, $SiF_4$, $(SiF_2)_5$, $(SiF_2)_6$, $(SiF_2)_4$, $Si_2F_6$, $Si_3F_8$, $SiHF_3$, $SiH_2F_2$, $Si_2H_2F_4$, $Si_2H_3F_3$, $SiCl_4(SiCl_2)_5$, $SiBr_4$, $(SiBr_2)_5$, $Si_2Cl_6$, $SiHCl_3$, $SiHBr_2$, $SiH_2Cl_2$, $Si_2Cl_3F_3$ etc in a gaseous or easily gasifiable state.

Further, as "A" for the compound (2), there can be mentioned those elements belonging to the group IV of the periodical table, specifically, Ge, C, Su, Pb. As the compound (2) containing these elements, there can be mentioned germanium-containing compounds, for example, a linear germane or germanium halide represented by the formula $Ge_uY_{2u+2}$, where u represents an integer of 1 or greater and Y represents at least one element selected from F, Cl, Br and I: a cyclic germane or germanium halide represented by the formula: $Ge_vY_{2v}$, where v represents an integer of 3 or greater and Y has the same meanings as described above: and a linear or cyclic germanium compound represented by the formula: $Ge_uH_xY_{ypt}$, where u is an integer of 1 or greater, Y is at least one element selected from F, Cl, Br and I, and $x+y=2u$ or $2u+2$, as well as organic germanium compounds having alkyl groups, etc. Specifically, there can be mentioned, for example, $GeH_4$, $Ge_2H_6$, $Ge_3H_8$, n-$Ge_4H_{10}$, t-$Ge_4H_{10}$, $GeH_6$, $Ge_5H_{10}$, $GeH_3F$, $GeH_3Cl$, $GeH_2F_2$, $Ge(CH_3)_4$, $Ge(C_2H_5)_4$, $Ge(C_6H_5)_4$, $Ge(CH_3)_2F_2$, $GeF_2$, $GeF_4$, $GeS$, etc.

Further, as the compounds containing carbon, there can be used those linear or cyclic hydrocarbon compounds in which hydrogen atoms are partially or entirely substituted with halogen atoms, for example, linear carbon halides represented by the formula: $C_uY_{2u+2}$, where u represents an integer of 1 or greater and Y represents at least one element selected from H, F, Cl, Br and I, such as $CH_4$, $C_2H_6$, $C_3H_8$, n-$C_4H_{10}$, $C_5H_{12}$, $C_2H_4$, $C_3H_8$, $C_4H_8$, $C_5H_{10}$, $C_2H_2$, $C_3H_8$, $C_4H_6$ a cyclic carbon halides represented by the formula: $C_vY_{2v}$, where v represents an integer of 3 or greater and Y has the same meanings as described above: and a linear or cyclic carbon compound represented by the formula: $C_uH_xY_y$, where u represents an integer of 1 or greater, Y represents at least one element selected from F, Cl, Br and I, and $x+y=2u$ or $2u+2$. Examples of the latter two compounds are, for example, $CF_4$, $(CF_2)_5$, $(CF_2)_6$, $(CF_2)_4$, $C_2F_6$, $C_3F_8$, $CHF_3$, $CH_2F_2$, $CCl_4$, $(CCl_2)_5$, $CBr_4$, $(CBr_2)_5$, $C_2Cl_6$, $C_2Cl_3F_3$ etc.

Furthermore, as the compound containing tin, there can be mentioned, for example, $SnH_4$, $SnCl_4$, $BnBr_4$, $Sn(CH_4)$, $Sn(C_2H_5)_4$, $Sn(C_3H_7)_4$, $Sn(C_4H_9)_4$, $Sn(OCH_3)_4$, $Sn(OC_2H_5)_4$, $Sn(i-OC_3H_7)_4$, $Sn(t-OC_4H_9)_4$, etc. As the compound containing lead, there can be mentioned, for example, $Pb(CH_3)_4$, $Pb(C_2H_5)_4$, $Pb(C_4H_9)_4$, etc.

For the compounds (1) and (2), the raw material described above may be used alone or, if required, two or more of them may be used.

In the process according to the second invention, it is preferred, for the compound (3) that contains a valence electron controlling element as the constituent element, to select those compounds which are gaseous under normal temperature or normal pressure, or gases at least under the conditions for forming the deposited film and can easily be gasified in an appropriate gasifying device.

As the compound (3) used in the process according to the present invention, those compounds containing the elements of the group III and V of the periodical table can be mentioned effective in the case of obtaining a desired deposited group IV film. Specifically, there can be mentioned, as the compounds containing the group III element: $BX_3$, $B_2H_6$, $B_4H_{10}$, $B_5H_9$, $B_5H_{11}$, $B_6H_{10}$, $B(CH_3)_3$, $B(C_2H_5)_3$, $B_6H_{12}$, $AlX_3$, $Al(CH_3)_2Cl$, $Al(CH_3)_3$, $Al(OCH_3)_3$, $Al(CH_3)Cl_2$, $Al(C_2H_5)_3$, $Al(OC_2H_5)_3$, $Al(CH_3)_3Cl_3$, $Al(i-C_4H_9)_5$, $Al(i-C_3H_7)_3$, $Al(C_3H_7)_3$, $Al(OC_4H_9)_3$, $GaX_3$, $Ga(OCH_3)_3$, $Ga(OC_2H_5)_3$, $Ga(OC_3H_7)_3$, $Ga(OC_4H_9)_3$, $Ga(CH_3)_3$, $Ga_2H_6$, $GaH(C_2H_5)_2$, $Ga(OC_2H_5)(C_2H_5)_2$, $In(CH_3)_3$, $In(C_3H_7)_3$, $In(C_4H_9)_3$, etc.: as the compound containing the group V element: $NH_3$, $HN_3$, $N_2H_5N_3$, $N_2H_4$, $NH_4N_3$, $PX_3$, $(P(OCH_3)_3$, $P(OC_2H_5)_3$, $P(C_3H_7)_3$, $P(OC_4H_9)_3$, $P(CH_3)_3$, $P(C_2H_5)_3$, $P(C_3H_7)_3$, $P(C_4H_9)_3$, $P(OCH_3)_3$, $P(OC_2H_5)_3$, $P(OC_3H_7)_3$, $P(OC_3H_9)_3$, $P(SCN)_3$, $P_2H_4$, $PH_3$, $AsH_3$, $AsX_3$, $As(OCH_3)_3$, $As(OC_2H_5)_3$, $As(OC_3H_7)_3$, $As(OC_4H_9)_3$, $As(CH_3)_3$, $As(CH_3)_3$, $As(C_2H_5)_3$, $As(C_6H_5)_3$, $SbX_3$, $Sb(OCH_3)_3$, $Sb(OC_2H_5)_3$, $Sb(OC_3H_7)_3$, $Sb(OC_4H_9)_3$, $Sb(CH_3)_3$, $Sb(C_3H_7)_3$, $Sb(C_4H_9)_3$, etc.

In the foregoings, X represents a halogen atom (F, Cl, Br, I).

The raw materials as described above may be used alone or two or more of them be used in combination.

In the case where the raw material described above is gaseous under the normal temperature and normal pressure, the amount introduced into the film forming space or activation space is controlled by a mass flow controller, etc. In the case where the material is liquid, it is gasified by using a rare gas such as Ar or He or gaseous hydrogen as a carrier gas and, as required, by using a bubbler capable of temperature control. In the case where it is in a solid state, it is gasified by using a rare gas such as Ar or He or gaseous hydrogen as a carrier gas and using a heat sublimation furnace, and the amount of introduction is controlled mainly by the control for the carrier gas flow rate and the temperature.

In the first invention, the hydrogen atoms in excited state used are introduced into the film forming space simultaneously with the formation of a deposited film in the space to chemically react with the compound or the compound in excited state that contains the group IV element to be the constituent element as the main constituent for a deposited film to be formed. As a result, a semiconductor deposited film constituted mainly with group IV atoms having a desired function is formed on a substrate at a lower substrate temperature and more easily as compared with the usual case. In the same manner, the hydrogen atoms in excited state used in the second invention are introduced simultaneously into the film-forming space upon forming a deposited film in the space to chemically react with the compound (1) and (2) and/or the compound (1) in excited state and/or the compound (2) in excited state containing the constituent elements as the main constituent for a deposited film to be formed. As a result, a deposited group IV film having a desired function is formed on a desired substrate at a lower substrate temperature and more easily as compared with the usual case.

For previously activating the compound containing the group IV element or the compounds (1) and (2) and the compound capable of valence electron control in the activation space disposed separately from the film forming space, activation energy such as of heat, light and electric discharge can be mentioned as the energy source that is applied to the activation space.

Specifically, there can be mentioned heat energy by ohmic heating, infrared heating, etc., light energy such as of laser beams, mercury lamp rays, halogen lamp rays, etc. and electric discharge energy such as of microwaves, RF, low frequency and DC. Such activation energy may be applied in the activation space alone or in combination of two or more of them. For effectively utilizing the effect of the activating energy, the catalytic effect may also be used in combination.

In the present invention, a hydrogen gas or a gas mixture composed of a hydrogen gas and a rare gas is used for forming the hydrogen atoms in excited state. If a microwave plasma can not be stabilized or the plasma is not generated only by means of gaseous hydrogen, it is effective to properly mix rare gas.

As the rare gas used in the present invention, there can be preferably mentioned He, Ne, Ar, Kr, Xe and Rn.

Now, explanation will be made for the method of forming a microwave plasma having a cavity resonator structure integrated with two impedance matching circuits in a microwave circuit used in the present invention.

Figure 7:
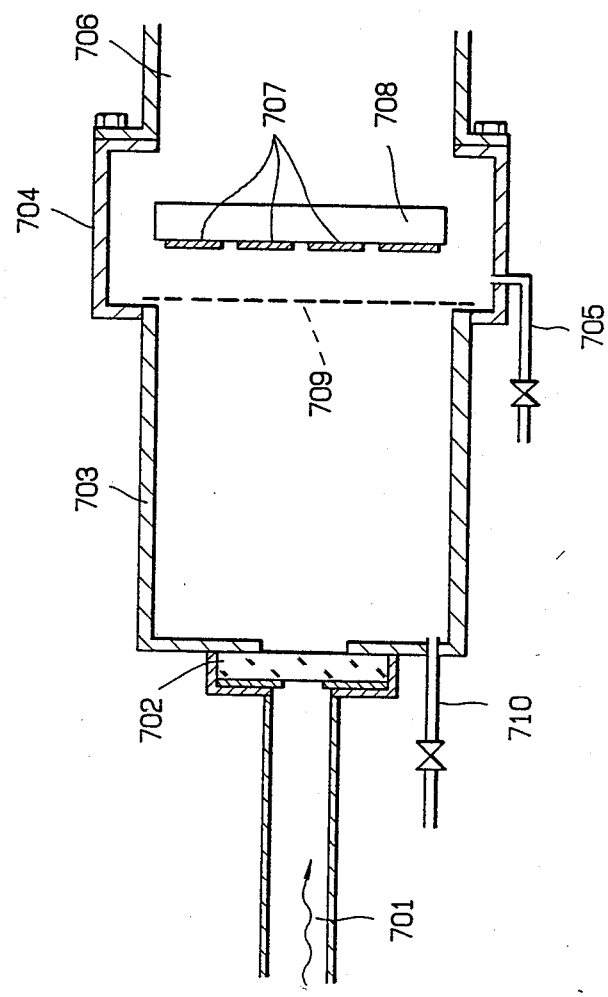
FIG. 7 is a schematic cross sectional view for the constitution of the conventional microwave plasma CVD apparatus.

For the comparison, the method of forming a microwave plasma used so far is to be explained at first. FIG. 7 shows a schematic cross sectional view for the constitution of the known microwave CVD apparatus.

In FIG. 7, there are shown a rectangular waveguide tube 701, a microwave introducing window 702, a plasma generation chamber 703, a film forming chamber 704, gas supply pipes 705, 710, an exhaust port 706, objects 707 to be processed, an object holder 708 and a metal mesh member 709 respectively.

As shown in FIG. 7, the apparatus comprises the plasma generation chamber 703 and the film forming chamber 704 with the use of plasma, in which the plasma forming chamber 703 and the film forming chamber 704 are partitioned by the metal mesh member 709 and permeation thereof is controlled so that microwave and charged particles are not introduced directly into the film forming chamber 704. The plasma generation chamber 703 has a structure as a cavity resonator, and the microwave propagated through the rectangular waveguide tube 701 is introduced into the plasma generation chamber 703 by way of the microwave introducing window 702 comprising dielectric material such as quartz ($SiO_2$), aluminum ceramics ($Al_2O_3$), teflon, etc. The objects 707 to be processed are disposed in the film forming chamber 704, which is provided with the gas supply pipe 705 and the exhaust port 706 for evacuating the plasma generation chamber 703 and the film forming chamber 704.

Upon actuating the microwave plasma generation apparatus thus constituted, the microwave is introduced from the rectangular waveguide tube 701 into the plasma generation chamber 703, and hydrogen gas, etc. as introduced through the gas introduction port 710 is converted into plasmas by the electric field energy of microwave to cause a great amount of hydrogen atoms in excited state. The hydrogen atoms in excited state are introduced by way of the metal mesh member 709 into the film forming chamber 704, where they collide against gases supplied from the gas introduction pipe 705 and cause chemical reactions among them to thereby form a deposited film on the objects 707 to be processed.

However, in the case of using the conventional microwave plasma generation apparatus having the aforementioned constitution, if the rectangular waveguide tube 701 is clamped with the plasma generation chamber 703 as the cavity resonator, since the input impedance is not matched, there is a problem that most of the electric field energy of microwave is reflected, failing to effectively utilize the energy.

As one of the countermeasures for the problem, there has been employed a method of arranging electromagnets around the cavity resonator to attain ECR (Electron Cyclotron Resonance)(refer to Japanese Patent Laid-open Sho 55-141729). However, since a magnetic flux density as high as 875 gauss is required in this method, the apparatus is rather large in size and heavy in weight. Further, the chamber is so designed that it constitutes a cavity resonator usually in vacuum. In view of this, if a plasma is generated by electric discharge, since the refractive index of the plasma is smaller than 1, it no more functions as the cavity resonator (refer to "Discharge Handbook" edited by Electric Society, Part 4, Chapter 2, 298p). In addition, in the case of forming a static magnetic field by the electromagnets, since electric current changes under heating by the coiled wire member, not only a considerable time is required for stably preparing ECR conditions (that is, magnetic flux density as high as 875 gauss) while suppressing such changes, but also there is a problem that if it goes out of the ECR conditions, the absorption rate of microwave is reduced and the improvement in the efficiency for utilizing the electric field is difficult till it is stabilized.

Accordingly, the present inventors have found it effective as the means for overcoming the foregoing problems to constitute such a structure that can operate as a cavity resonator irrespective of the presence or absence or the density of a plasma and to dispose a bell jar as the plasma generation chamber in the cavity resonator for exciting a TM mode.

Specifically, in the cavity resonator structure, a cavity length varying plunger is disposed and the rectangular wave guide tube and the cylindrical cavity resonator are clamped with each other such that their axes are in perpendicular with each other as shown in FIG. 1. Furthermore, for carrying out the impedance matching, it is preferred to employ either one of a restriction to the junction between the rectangular waveguide tube and the cavity resonator or an E-H tuner or three-stub tuner disposed in combination with the cavity length varying pluger.

The bell jar for forming a plasma disposed in the cavity resonator has microwave permeability and it is formed with those materials capable of keeping gas tightness, for example, so-called new ceramics such as quartz ($SiO_2$), alumina ceramics ($Al_2O_3$), boron nitride (BN), silicon nitride ($Si_3N_4$), silicon carbide (SiC), beryllia (BeO), magnesia (MeO), zirconia ($ZrO_2$), etc.

The cavity length varying plunger is disposed to the bell jar on the side of introducing the microwave, that is, on the side of the atmosphere. Accordingly, since impedance can be matched by varying the cavity length in the atmospheric air, the cavity length can be adjusted easily depending on the absence or presence of a plasma or on the change of cavity resonance conditions due to the change of the plasma density, thereby enabling to generate a microwave plasma at good reproducibility and stability.

In the present invention, the metal mesh member disposed between the bell jar and the film forming space has a function as an end face plate for establishing the conditions for the cavity resonance and, accordingly, it is desirable that the diameter of the mesh member is preferably less than $\lambda/2$ and, optimally, less than $\lambda/4$ relative to the wavelength of the microwave in the tube used.

The metal mesh member has a shape of a metal gage, a thin metal plate perforated with round or polygonal apertures, etc. and may consist of material such as so called metal element, for example, Al, Fe, Ni, Ti, Mo, W, Pt, Au, Ag and stainless steel or glass, ceramics applied with surface treatment with the metals described above by means of plating, sputtering, vapor deposition, etc. or metal composite material.

Further, it is desirable that the diameter and the distribution of apertures of the metal mesh member are varied in order to introduce the hydrogen atoms in excited state formed in the bell jar efficiently and uniformly into the film forming space. The entire porosity is preferably, 10% or more, more preferably, 20% or more and, most preferably, 30% or more.

For attaining the uniform thickness and uniform property of a resulting deposited film to be formed on the substrate in the present invention, examinations have been made for the distance of the substrate from the metal mesh member and for the angle of the metal mesh member relative to the horizontal axes, and as a result, the following results were obtained.

Figure 3:
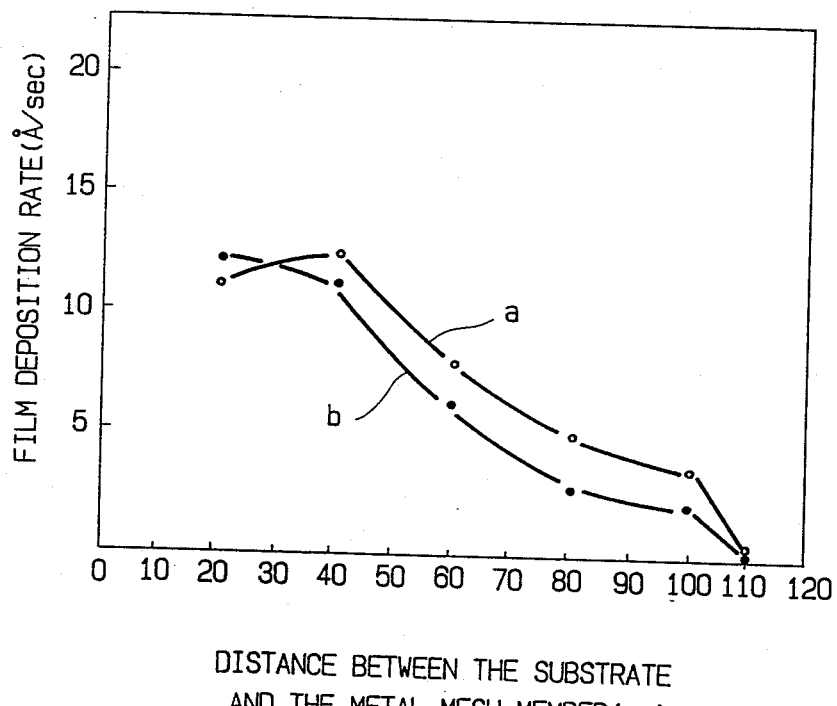
FIG. 3(1) and FIG. 3(2) are, respectively, graphs illustrating relationships of the film deposition rate to the distance between a substrate and a metal mesh member in the process for forming a deposited film by a microwave plasma CVD process according to the present invention.
Figure 3:
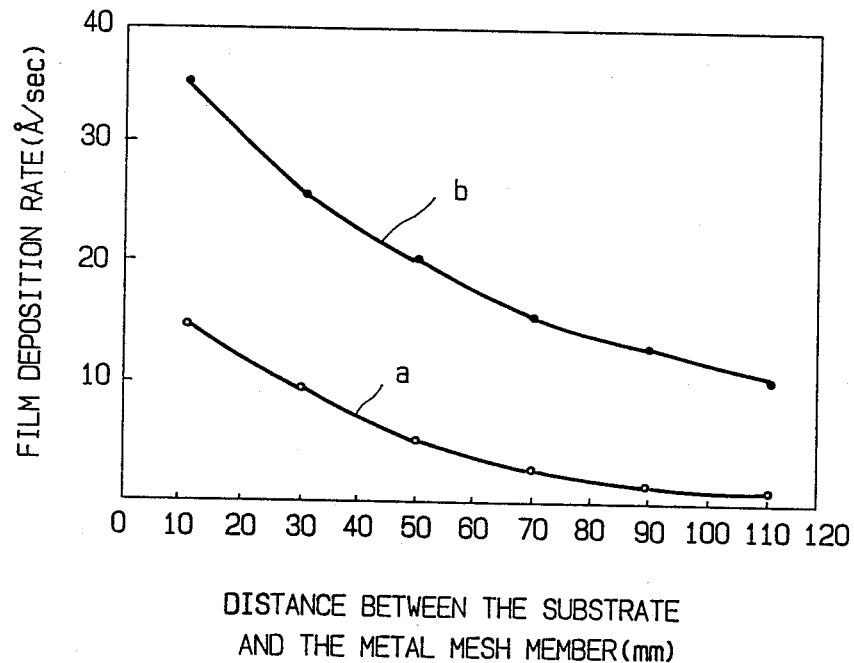

FIG. 3(1) shows typical two examples each illustrating a relationship of the deposition rate of the deposited film formed relative to the distance between the substrate and the metal mesh member, in which the curve a comprising plotted marks "O" and the curve b comprising plotted marks "●", which were obtained respectively under the film forming conditions (A) and (B) shown in Table 1(1).

Figure 4:
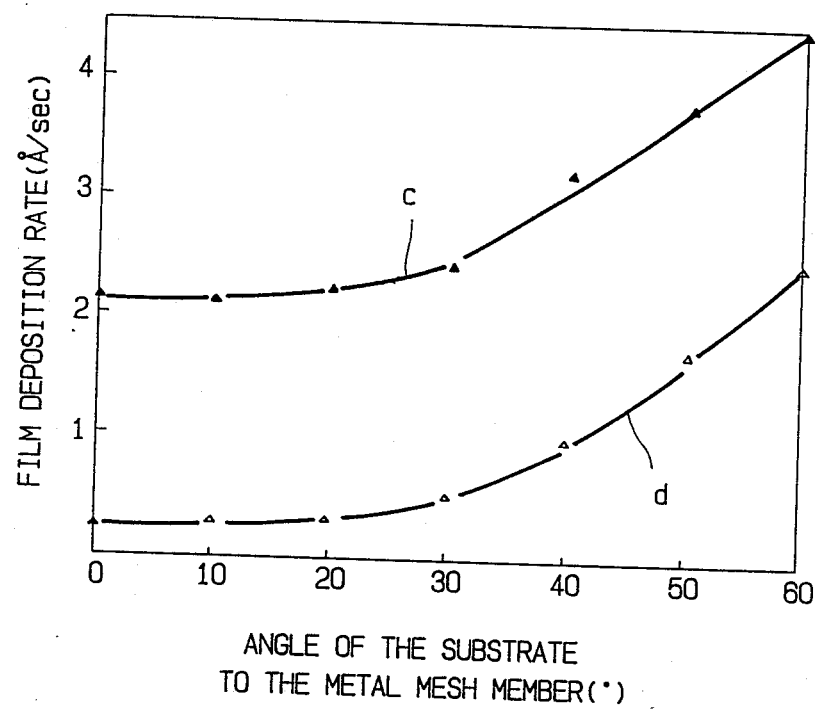
FIG. 4(1) and FIG. 4(2) are, respectively, graphs illustrating relationships of the difference in the film deposition rate in the formed deposited film relative to the angle between the substrate and the metal mesh member in the process for forming a deposited film by a microwave plasma CVD process according to the present invention.
Figure 4:
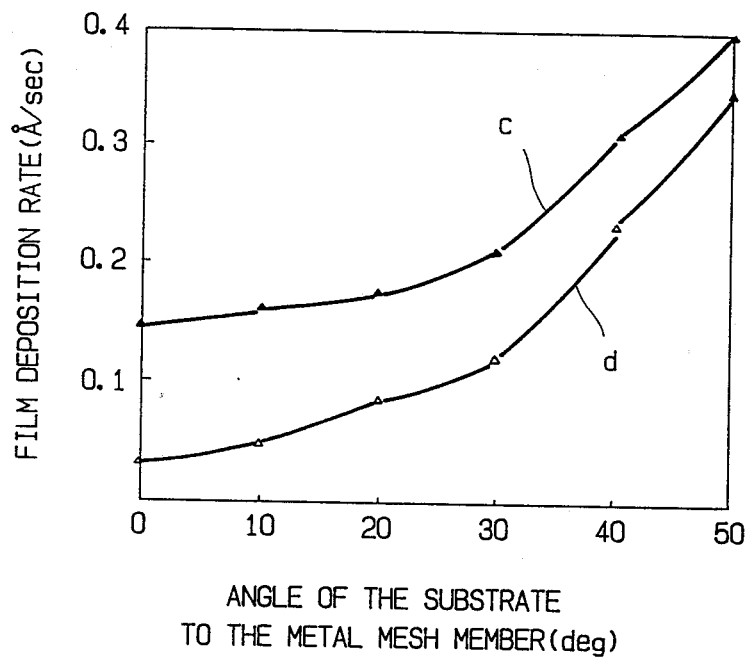

And, FIG. 4(1) represents the film thickness distribution of the film deposited on the substrate as the difference of the deposition rate when the angle between the substrate and the metal mesh member is changed in the cases where the distance between the substrate and the metal mesh member is 40 mm (curve c plotted by "▲") and 80 mm (curve d, plotted by "Δ") under the film forming conditions (A).

FIG. 3(2) shows typical two examples each illustrating a relationship of the deposition rate of the deposited film formed relative to the distance between the substrate and the metal mesh member, in which the curve a comprising plotted marks "O" and the curve b comprising plotted marks "●", which were obtained respectively under the film forming conditions (A) and (B) shown in Table 1(2). FIG. 4(2) represents the film thickness distribution of the film deposited on the substrate when the angle between the substrate and the metal mesh member is changed as the difference of the deposition rate in a case where the distance between the substrate and the metal mesh member is 30 mm (curve c plotted by "▲") and 70 mm (curve d, plotted by "Δ") under the film forming condition (B).

As can be seen from FIGS. 3(1) and (2), the deposition rate tends to decrease rapidly as the distance between the substrate and the metal mesh member is increased. Particularly, under the film forming condition (A), formation of the deposited film is scarcely observed if the distance exceeds 100 mm. Also under the film forming condition (B), the deposited film formed at the distance in excess of 100 mm has poor characteristic and is not suitable to practical use. In addition, from FIG. 4(1) and (2), it has been found that the distribution of the film thickness is rapidly increased if the angle between the substrate and the metal mesh member exceeds 30 degree in all of the positions for the substrate and, in relation therewith, the distribution of the film property is also increased to remarkably decrease the uniformity.

TABLE 1(1)

| Item | Film forming condition | (A) | (B) |
|---|---|---|---|
| Substrate temperature | | | 220° C. |
| Compound containing group IV element | | $Si_2F_6$ | 10 sccm |
| Hydrogen atom forming raw material gas | | $H_2$ | 50 sccm |
| | | Ar | 150 sccm |
| Pressure upon film formation | | 0.02 Torr | 0.04 Torr |
| Metal mesh member | | Punched Al board (100 mmφ), 6 mm pore size, 45% porosity; uniform pore distribution | |
| Gas revelation means for the compound containing group IV element | | Annular liberation ring having 2 mmφ apertures, formed at 8 positions at an equal distance, disposed apart by 10 mm from the metal mesh member | |
| Microwave charging power | | 250 W | 350 W |

TABLE 1(2)

| | (A) | (B) |
|---|---|---|
| Substrate temperature | 250° C. | 250° C. |
| Compound (1) | $Si_2F_6$ 10 sccm | $Si_2F_6$ 10 sccm |
| Compound (2)* | $GeF_4$ 10 sccm | $GeF_4$ 10 sccm |
| Hydrogen atom forming raw material gas | $H_2$ 10 sccm | $H_2$ 10 sccm |
| | Ar 200 sccm | Ar 200 sccm |
| Pressure upon film formation | 0.05 Torr | 0.15 Torr |
| Metal mesh member | Pore size: φ 6 mm, distributed uniformly Porosity: 45 % Al: 120 mm φ | Pore size: φ 6 mm, distributed uniformly Porosity: 30 % Al: 120 mm φ |
| Gas liberation means for the compound (1) and (2) | Annular liberation ring Pore size: 2 mmφ × 8 (equi distance) Disposed at 10 mm from metal mesh | Annular liberation ring Pore size: 2 mmφ × 8 equi distance) Disposed at 10 mm from metal mesh |
| Microwave charging power | 250 W | 300 W |

*The compound (2) is diluted for use to 10% with He gas.

The same examinations as described above were also conducted upon forming other group IV semiconductor thin films under several conditions and substantially the same results were obtained in each of the cases.

Accordingly, in the present invention, it is defined that the distance between the substrate and the metal mesh member is preferably, 100 mm or less, more preferably, 70 mm or less, and the angle between the substrate and the horizontal axis of the metal mesh member is preferably 30 degree or less and, more preferably, 20 degree or less, as necessary conditions in order to keep the uniformity for the distribution and the property of the film thickness and the film property within ±5%.

In addition, further examinations have been conducted on the gas liberation means for the group IV element compound or the compounds (1) and (2) and, if required, the compound containing an element capable of valence electron control as the constituent element in the present invention in order to improve the uniformity of the film thickness distribution and the film property.

The range of pressure preferably used in the present invention is in an intermediate flow region situated between a viscosity flow and a molecular flow referred to in the fluid technology, for which the conductance calculation formula in the molecular flow region can not be used. Accordingly, in the present invention, the following experiments have been conducted while taking notice of the apertures size, distance and distribution of the gas liberation apertures disposed to the gas liberation means, to thereby obtain the results as shown in FIG. 5(1), (2) and FIGS. 6(1), (2).

Figure 2A:
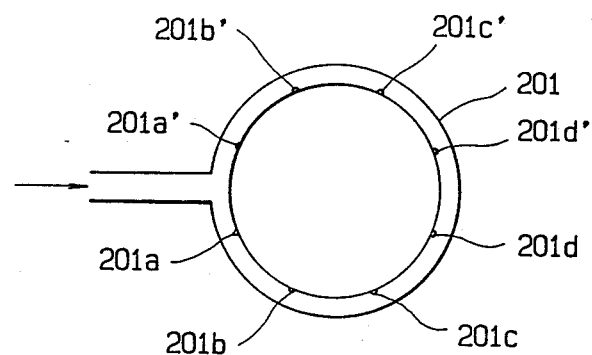
FIG. 2(a), FIG. 2(b) and FIG. 2(c) are, respectively, schematic explanatory views of the gas liberation rings to be employed in the apparatus shown in FIG. 1.
Figure 5:
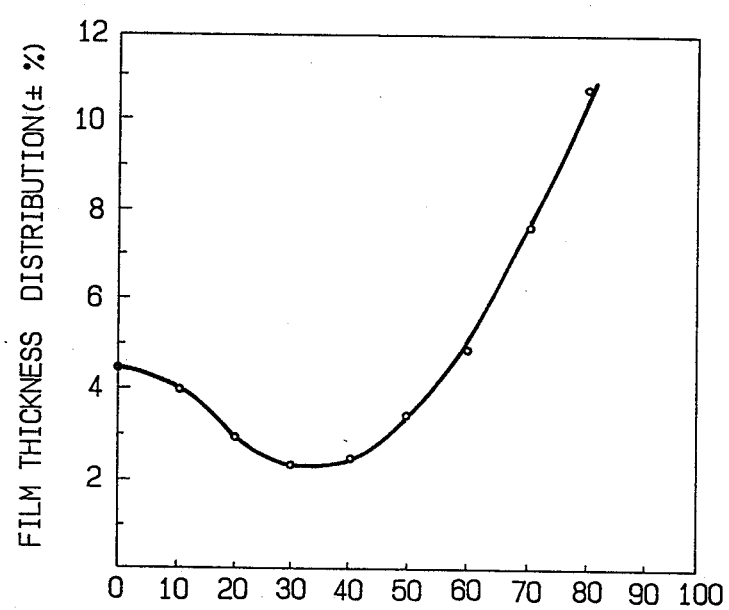
FIG. 5(1) and FIG. 5(2) are, respectively, graphs illustrating relationships of the film thickness distribution in the deposited film formed relative to the increasing rate of the diameter for the gas liberation apertures of the gas liberation rings illustrated in FIG. 2(a) through FIG. 2(c) in the apparatus used upon practicing the microwave plasma CVD process according to the present invention.
Figure 5:
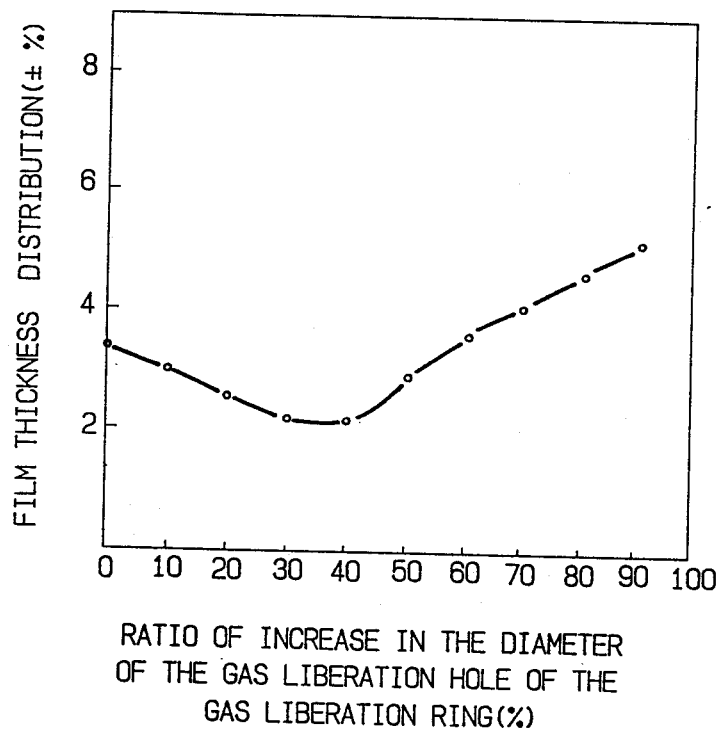

FIG. 5(1) illustrates the results obtained by forming a deposited film under the film forming conditions (A) shown in Table 1(1), by setting the substrate at a distance of 40 mm and using the gas liberation ring 201 shown in FIG. 2(a). Further, FIG. 5(2) illustrates the results obtained by forming a deposited film under the film forming conditions (A) shown in Table 1(2), by setting the substrate at a distance of 30 mm and using the gas liberation ring 201 shown in FIG. 2(a).

In the gas liberation ring 201 shown in FIG. 1(a), eight liberation apertures 201a–201d, 201a'–201d' are apertured each at an equal distance, in which the aperture diameter is gradually increased from the liberation apertures 201a, 201a' nearest in the direction of the arrow (→) toward the downstream to the apertures 201d, 201d'. FIGS. 5(1) and (2) illustrate the change of the film thickness distribution for deposited films to be formed by using each of the gas liberation rings manufactured while varying the increasing rate for the aperture diameter from 0 to 80%.

As can be seen from the result, it is recognized that although the film thickness distribution is improved within a range for the aperture diameter increasing rate from about 0 to 40%, the film thickness distribution is rather increased if it exceeds 40%, and the film thickness distribution is further increased if it exceeds 60%, than the case where the aperture diameter is unchanged (aperture diameter increasing rate 0%). The film property shows a relationship substantially correlated with the film thickness distribution. The trend is substantially the same also under other film forming conditions.

Accordingly, in the present invention, it is desirable to set the aperture diameter increasing rate, preferably, from 0 to 50% and, more preferably, from 20 to 40%.

Figure 2B:
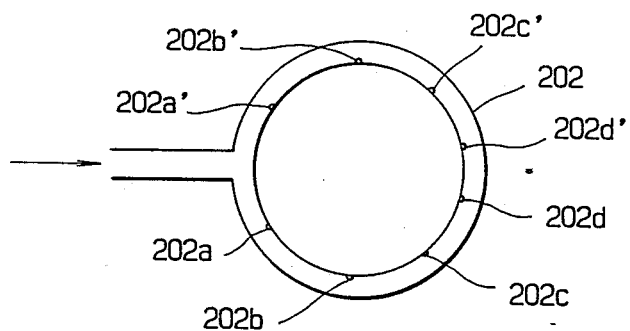
Figure 6:
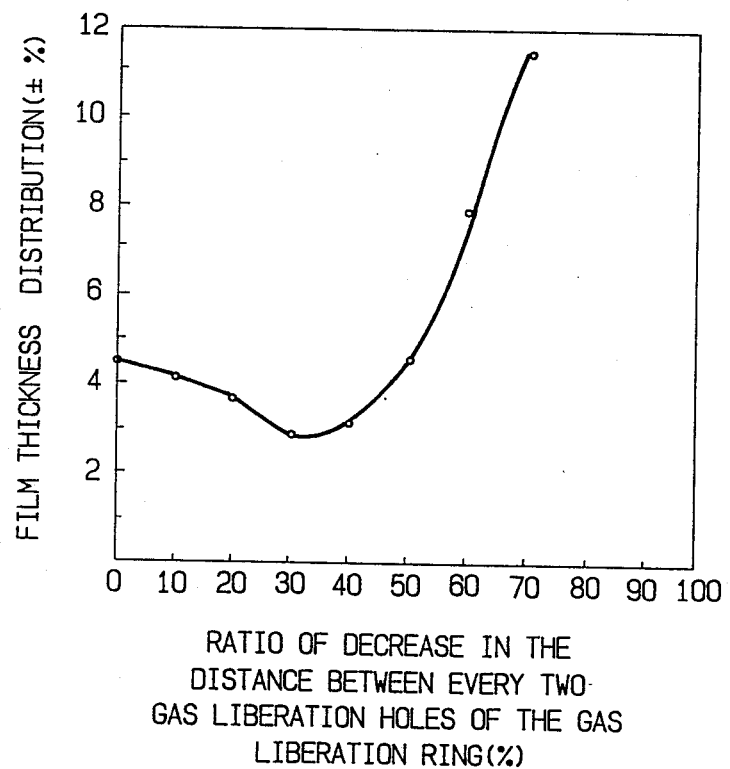
FIG. 6(1) and FIG. 6(2) are, respectively, graphs illustrating relationships of the film thickness distribution in the deposited film formed relative to the decreasing rate of the interval for the gas liberation apertures of the gas liberation rings illustrated in FIG. 2(a) through FIG. 2(c) in the apparatus used upon practicing the microwave plasma CVD process according to the present invention.
Figure 6:
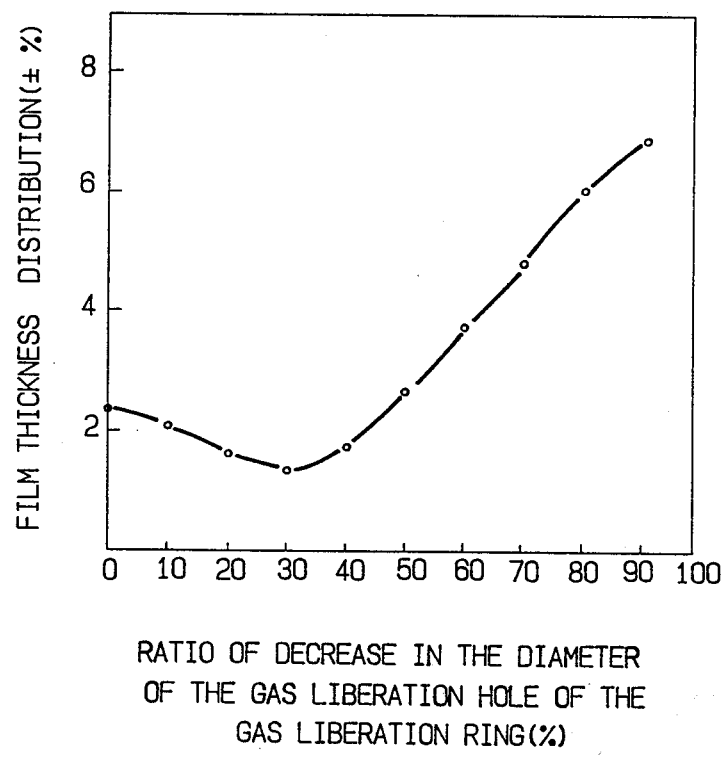

Then, FIGS. 6(1) and (2) show the results of the experiments conducted under the same film forming conditions as above by using the gas liberation ring 202 shown in FIG. 2(b).

In the gas liberation ring 202 shown in FIG. 2(b) eight liberation apertures 202a–202d and 202a'–202d' of an identical aperture diameter are perforated with the distance being gradually decreased with reference to the distance between the liberation apertures 202a and 202a', and the change of the film thickness distribution of the deposited film formed by using each of the gas liberation rings manufactured while varying the decreasing rate from 0 to 70% is shown in FIGS. 6(1) and (2).

As a result, it has been recognized that while the film thickness distribution is improved within a range for the inter-aperture distance decreasing rate from 0 to 40%, the film thickness distribution is rather increased if it exceeds 40%,and the film thickness distribution is further increased if it exceeds 50% than in the case where the aperture distance is unchanged (inter-aperture distance decreasing rate: 0%).

The film property shows the relationship substantially correlated with the film thickness distribution. The trend is substantially the same also under other film forming conditions.

Accordingly, in the present invention, it is desirable to set the inter-aperture distance decreasing rate to, preferably, a range of from 0 to 50% and, more preferably, a range of from 20 to 40%.

Figure 2C:
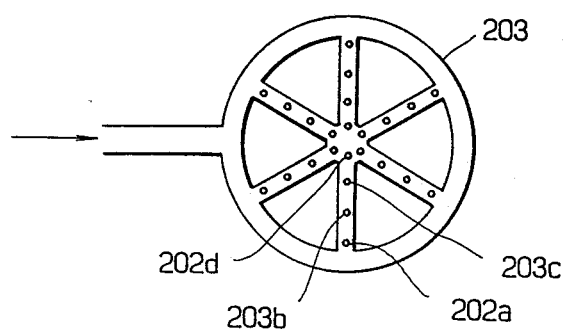

Further, the same experiments as those for determining the relationship shown in FIGS. 5(1), (2) were conducted by using the gas liberation ring 203 shown in FIG. 2(c). In the gas liberation ring 203 shown in FIG. 2(c), liberation apertures 203a–203d are uniformly distributed and the aperture diameter is increased in the direction from 203a to 203d. The trend in the change of the film thickness distribution and the film property obtained by using gas liberation rings having various increasing rates was substantially the same as the result shown in FIGS. 5(1), (2).

Accordingly, in the case of the distribution for the gas liberation apertures as shown in FIG. 2(c) in the present invention, it is desirable to set the aperture diameter increasing rate to, preferably, a range of from 0 to 40% and, more preferably, a range of from 10 to 30%.

In the present invention, the inner pressure of the film forming stage may properly be determined upon film formation depending upon the conditions for stably forming a microwave plasma from a hydrogen gas or a gas mixture composed of a hydrogen gas and a rare gas, as well as the kind and the state selected for the compound containing the group IV element or compounds (1) and (2) and the compound capable of controlling valence electron, as well as desired property of the deposited films, etc. It is desirable to set the inner pressure to, preferably, a range of from 100 to $1 \times 10^{-4}$ Torr, more preferably, a range of from 10 to $5 \times 10^{-4}$ Torr and, most preferably, a range of from 1 to $1 \times 10^{-3}$ Torr.

By the method according to the present invention, a deposited film having desired crystallinity can be formed on a substrate of any crystallinity irrespective of its amorphous or crystalline property.

In the present invention, the oscillation mode in the microwave oscillator, in order to establish a stable cavity resonance condition, is a continuous oscillation mode, having a ripple in the power range used preferably within a range of 30%.

By the process according to the present invention, hydrogen atoms in excited state can be formed with good controllability, stably and with good reproducibility by a microwave plasma using a cavity resonator integrated with two impedance matching circuits in a microwave circuit, whereby the controllability for the reaction between the hydrogen atoms in excited state and the film-forming raw material compound can be remarkably improved, and a semiconductor film of the group IV element having desired crystallinity, hydrogen content, etc. can be formed with good uniformity, high efficiency and good reproducibility.

Description will be made for a typical embodiment of the deposited film forming apparatus suitable for practicing the process according to the present invention, but it should be noted that the present invention is not restricted only to such a deposited film forming apparatus.

FIG. 1 is a schematic view schematically illustrating the constitution of the deposited film forming apparatus suitable for practicing the process according to the present invention.

In FIG. 1, a cylindrical cavity resonator 101 comprises a bell jar 102 as a microwave plasma generation chamber, a metal mesh member 103, a cavity length varying plunger 104, a rectangular waveguide tube 108 and a restriction 110 as the main constituent components. A spring 104 made of phosphor bronze is disposed for improving the contact between the plunger 102 and the cylindrical cavity resonator 101 to prevent abnormal electric discharge. The cavity length varying plunger 104 can be moved by a motor 106 and a speed change gear 107 toward the bell jar 102. An E-H tuner or a three-stub tuner 109 constitutes one of impedance matching circuits constituting a microwave circuit in the present invention, which is used for the impedance matching being paired with the resonance length varying plunger 102 as the other of the impedance matching circuits. The restriction 110 constitutes one of the impedance circuits in the same manner and it is used being paired with the cavity length varying plunger 102.

Restrictions 110 are disposed in a pair on the right and left the junction between the rectangular waveguide tube 108 and the cylindrical cavity resonator 101 and so adapted that they can be moved slindingly along the cylindrical surface of the rectangular waveguide tube 108 in the longitudinal direction independent of each other and kept in contact with the cylindrical cavity resonator 101 by means of springs made of phosphor bronze not illustrated.

A liberation aperture for a hydrogen gas or a gas mixture of a hydrogen gas and a rare gas from a gas introduction pipe 111 is passed through the metal mesh member and directed to the inside of the bell jar 102. Hydrogen gas, etc. introduced into the bell jar 102 is converted into a plasma by microwaves charged into the cavity resonator 101 to form hydrogen atoms, etc. in an excited state, which are then introduced through the metal mesh member 103 into the film forming space 116. The pressure in the film forming space is measured by a pressure gage 125.

In the film forming space 116, a raw material gas liberation ring 112 for forming a deposited film is disposed between a substrate 118 and a substrate holder 119.

An activation space 114 is used for previously activating the film-forming raw material as introduced from a gas supply pipe 120, if necessary, around which activating energy generation means 115 for generating energy such as heat, light, electric discharge is disposed.

In a case where the previously activated film-forming raw material gas is introduced, it is desirable that a transportation pipe 117 has such a diameter and consists of such material as capable of maintaining the activated stated.

For the gas liberation ring 112, gas liberation apertures 113 of the constitution as explained in FIG. 2 are formed.

The film-forming raw material gas, etc. introduced into the film forming space 116 is evacuated in the direction of the arrow shown in the drawing by means of an evacuation pump not illustrated.

A port 121 is disposed for the monitor of a microwave plasma, to which a light gathering probe 122 is connected. The light gathering probe 122 is connected by way of a quartz fiber 123 to a spectrometer not illustrated for conducting emission spectrophotometry. Reference numeral 124 denotes a stand-by port for the monitor of the plasma on the side of the film forming space.

DESCRIPTION OF THE PREFERRED EMBODIMENTS

The process for the formation of a deposited film according to the present invention will be described more in detail referring to the following examples. It should, however, be noted that the present invention is not restricted only to these examples.

EXAMPLE 1

At first, a glass substrate 118 of 150 $\phi$ diameter (Trade name: #7059, manufactured by Coning Glass Works) was placed on the substrate holder 119 in the film forming space 16, and the pressure in the film forming space 116 was reduced to $1 \times 10^{-6}$ Torr by evacuation using an evacuation pump not illustrated. Then, the substrate holder was heated such that the surface temperature of the substrate 118 was set to 220° C. by means of a substrate temperature controller not illustrated.

When the surface temperature of the substrate was settled, a mixture of $H_2$ gas at 20 sccm and Ar gas at 100 sccm was introduced from gas reservoirs not illustrated by way of the gas introduction pipe 111 to the quartz bell jar 102. Then, the pressure in the film forming space 116 was controlled to 0.1 Torr by using an automatic pressure controller not illustrated.

Then, microwave was charged from a continuous oscillation type microwave oscillator not illustrated by way of the rectangular waveguide tube 118 into the cavity resonator 111. Soon after, the cavity length varying plunger 104 is operated by the motor 106 and the speed change gear 107 and adjusted to such a position that the ratio of the reflection power/incident power measured by a power monitor disposed in a microwave circuit not illustrated and further the opening degree of the restrictions 110 was adjusted to such a position to minimize the ratio of the reflection power/incident power. Then, the operations for finely adjusting the position of the cavity length varying plunger 104 and the opening degree for the restrictions 110 were repeated so that the ratio of the reflection power-incident power was minimized and the value for the effective incident power represented by incident power-reflection power was set to 200 W.

A this instance, the intensity ratio of emission lines $H_{60}/H_\beta$ from the hydrogen atoms in the excited state monitored through the port 111 was 120.

The substrate 118 and the metal mesh member 103 were set at a distance of 40 mm in parallel with each other. A punched board made of aluminum having 150 $\phi$ diameter in which apertures each of 8 $\phi$ diameter were uniformly distributed with the porosity of 50%, was used as the metal mesh member 103. The gas liberation ring 112 used had a constitution as shown in FIG. 2(a) in which the aperture diameter corresponding to 201a, 201a' was 1.5 mm and the increasing rate of aperture diameter was 30%.

Subsequently, a mixture of 10 sccm of $Si_2F_6$ gas and 5 sccm of $BF_3$ (diluted with $SiF_4$ to 200 ppm) was introduced from gas reservoirs not illustrated, through the gas supply pipe 120 and from the gas liberation ring 112 into the film forming space 116. In this case, the pressure in the film forming space 116 was controlled by an automatic pressure controller so as to be maintained at 0.1 Torr. $BF_3$ also has a function as a dopant.

Soon, the hydrogen atoms in excited state and $Si_2F_4$, $BF_3$ caused chemical reaction to form a Si:H:F:B film of 4.2 μm film thickness (specimen No. 1-1) on the substrate 118 within 60 min.

After cooling and then taking out the substrate and replacing it with a 6 inch n+Si (110) wafer, the deposited film was formed under the same procedures as described above except for changing the H₂ gas flow rate to 150 sccm, the microwave charging power to 350 W, the pressure in the film forming space to 0.02 Torr and the substrate temperature to 280° C. The intensity ratio of $H_\alpha/H_\beta$ in this case was 40 (specimen No. 1-2).

When the film thickness distribution was measured and the crystallinity of the deposited film was evaluated by X-ray diffractiometry and electron ray diffractiometry (RHEED) on each of the deposited film specimens obtained, it was confirmed that the film thickness distribution was within ±3% for each of the specimens and that the specimen No. 1-1 was an amorphous film, while the specimen No. 1-2 was an epitaxial film having nearly (110) orientation at the surface in parallel with the substrate.

Each of the specimens was put into a vacuum deposition device and vapor deposited with a comb-type Al electrode of 250 μm gap width and dot electrode of 2 φ diameter by means of ohmic heating and, the electroconductivity ($\sigma$) ($\sigma p$: photoconductivty and $\sigma d$: dark electroconductivity) and the hole mobility ($u_h$) were measured by van der Pauw method. The value of $\sigma p/\sigma d$ was $4.5\times 10^5$ ($\sigma p$: value under AM-1 irradiation) for the specimen No. 1-1, and the value of $u_h$ was $450+13$ cm²/V.sec for the specimen No. 1-2 within the entire surfaces, and their characteristic distribution was about ±3%. Further, when the conduction type was examined by a thermovoltatic power measurement, all of them were of p-type.

Further, when the H content was measured by SIMS, it was 9 atomic % in the specimen No. 1-1 and 0.08 atomic % in the specimen No. 1-2.

From the foregoings, it has been found that the crystallinity can be controlled with ease according to the present invention.

EXAMPLE 2

Deposited films were formed in the same procedures as in Example 1 except for changing the microwave charging power from 200 W and 350 W to 150 W to 250 W, and heating the activation space 114 constituted with the quartz tube disposed on the gas supply pipe 120° to 700° C. by means of the infrared heating furnace 115 as the activating energy generation means (specimens No. 2-1, No. 2-2).

$H_{60}/H_{62}$ upon film formation was 155 in the specimen No. 2-1 and the 60 in the specimen No. 2-2.

When the deposited film obtained was evaluated in the same procedures as in Example 1, the deposition rate was increased by about 10% although the microwave charging power was reduced, and substantially the same properties as those obtained in Example 1 could be obtained as shown in Table 2.

EXAMPLE 3

A deposited film was formed in the same procedures and under the forming conditions for the specimen No. 1-2 in Example 1 except for replacing the substrate with a glass substrate (trade name: #7059: manufactured by Coning Glass Works) and setting the pressure in the film forming space to 0.06 Torr and the substrate temperature to 250° C. $H_\alpha/H_\beta$ upon film formation was 70.

When the film thickness distribution was measured for the deposited film thus obtained and the crystallinity of the deposited film was evaluated by X-ray diffractiometry and electron diffractiometry (RHEED), it has been confirmed that the film had a film thickness distribution within ±3% and it was a polycrystalline film having nearly (110) orientation at the surface in parallel with the substrate and having average grain size of 1.2 μm. The H content was 1.2 atomic %.

When the hole mobility was evacuated, it was $45\pm 1.3$ cm²/V.sec and the conduction type was p-type.

EXAMPLES 4–6

Deposited films were formed under the same procedures and film forming condition as those in Example 1 except for changing the film-forming material compound and a portion of the film forming conditions for those shown in Table 3.

When the film property was evaluated for the deposite films obtained, the results as shown in Table 4 were obtained and they were of high quality having the distribution of the film thickness and the film properties within a range of ±3%.

EXAMPLE 7

At first, a glass substrate 118 of 150 φ diameter (trade name: #7059, manufactured by Coning Glass Works) was placed on the substrate holder 119 in the film forming space 116, and the pressure in the film forming space 116 was reduced to $1\times 10^{-6}$ Torr by evacuation using an evacuation pump not illustrated. Then, the substrate holder was heated such that the surface temperature of the substrate 118 was set to 230° C. by means of a substrate temperature controller not illustrated.

When the surface temperature of the substrate was settled, a mixture of H₂ gas at 20 sccm and Ar gas at 200 sccm was introduced from gas reservoirs not illustrated by way of the gas introduction pipe 111 to the quartz bell jar 102. Then, the pressure in the film forming space 116 was controlled to 0.2 Torr by using an automatic pressure controller not illustrated.

Then, microwave was charged from a continuous oscillation type microwave oscillator not illustrated by way of the rectangular waveguide tube 118 into the cavity resonator 111. Soon after, the cavity length varying plunger 104 is operated by the motor 106 and the speed change gear 107 and adjusted to such a position to minimize the ratio of the reflection power/incident power measured by a power monitor disposed in a microwave circuit not illustrated and further the opening degree of the restrictions 110 was adjusted to such a position to minimize the ratio of the reflection power-/incident power. Then, the operations for finely controlling the position of the cavity length varying plunger 104 and the opening degree for the restrictions 110 were repeated so that the ratio of the reflection power/incident power was minimized and so that the value for the effective incident power represented by incident power-reflection power was set to 350 W.

At this instance, the intensity ratio of light emission line $H_\alpha/H_\beta$ from the hydrogen atoms in excited state monitored through the port 111 was 200.

The substrate 118 and the metal mesh member 103 were set at a distance of 40 mm and in parallel with each other. A punched board made of aluminum having 150 φ diameter with the porosity of 50%, in which apertures each of 8 φ diameter were uniformly distributed was used as the metal mesh member 103. The gas liberation ring 112 used had a constitution as shown in FIG. 2(a), in which the aperture diameter corresponding to 201a, 201a' was 1.5 mm and the aperture diameter increasing rate was 30%.

Subsequently, a mixture of 10 sccm of $Si_2F_6$ gas and 10 sccm of $GeF_4$ gas diluted with He gas to 10% was introduced from a reservoirs not illustrated, through the gas supply pipe 120 and from the gas liberation ring 112 into the film forming space 116. In this case, the pressure in the film forming space 116 was controlled by an automatic pressure controller so as to be maintained at 0.2 Torr.

Soon, the hydrogen atoms in the excited state and $Si_2F_4$, $GeF_4$ caused chemical reaction to form a film of 7.5 um film thickness on the substrate 118 within 60 min. The substrate was cooled and then taken out as specimen No. 7-1.

Further, the deposited film was formed in the same procedures as described above except for using a 6 inch n+Si (110) wafer as the substrate, and setting the $H_2$ gas flow rate to 100 sccm, Ar gas flow rate to 50 sccm, the pressure in the film forming space to 0.01 Torr and setting the porosity of the punched board to 30%. The intensity ratio $H_{60}/H_\beta$ was 40 (referred to as specimen No. 7-3). The film thickness distribution was measured on each of the deposited film specimens obtained and the crystallinity of the deposited films was evaluated by the X-ray diffractiometry and electron ray diffractiometry (RHEED). Each of the specimens had good uniformity and it was confirmed that the specimen No. 7-1 was an amorphous film, the specimen No. 7-1 was a polycrystalline film, and the specimen No. 7-3 was an epitaxial film having nearly (110) orientation at the surface in parallel with the substrate.

Further, a portion was cut out from each of the specimens and analyzed for the composition by SIMS. The H content was decreased in the order of the specimen No. 7-1, specimen No. 7-2 and specimen No. 7-3.

Each of the specimens was put into a vacuum deposition device, and vapor-deposited with a 2 φ diameter Al dot electrode by means of ohmic heating, and the hole mobility ($u_h$) was measured by van der Pauw method. The characteristic distribution was within a range of about ±3% in the entire surface of the specimen. The results are shown in Table 5.

From the results, it has been found that the crystallinity of the deposited films can be controlled with ease in accordance with the present invention.

EXAMPLE 8

A Si:Ge:H:F film was formed in the same procedures as those in Example 1 under the conditions as described below. Film was formed under the same conditions as those for preparing the specimen No. 1 in Example 7 except for setting the $GeF_4$ gas flow rate to 5 sccm (referred to as specimen No. 8-1).

Then, films were formed for three times in the same manners as described above except for setting the $GeF_4$ gas flow rate to 7 sccm, 12 sccm and 15 sccm respectively (referred to as specimens No. 8-2, No. 8-3, No. 8-4).

The film thickness distribution was measured for each of the deposited film specimens and the crystallinity of the deposited film was evaluated by X-ray diffractiometry and electron ray diffractiometry (RHEED). It has been confirmed that each of the specimens had good uniformity and was amorphous film.

Further, a portion was cut out from each of the specimens and analyzed for the composition by SIMS to determine the composition ratio between Si and Ge. Further, absorption spectrum was measured by a visible ray spectroscope for each of the specimens to determine an optical band gap. Furthermore, each of the specimens was put into a vacuum deposition chamber and vapor deposited with a comb-type aluminum gap electrode (gap width 250 μm, width 5 mm). The dark electroconductivity under voltage application of 10 V was measured and, thereafter, AM-1 light (100 mW/cm²) was irradiated to determine the photoconductivity and thereby determining the ratio between the dark conductivity and the photoconductivity. Each of the properties was within a range of about ±3% in the entire plane. The foregoing results are shown in Table 6. It has been found from the results that the composition ratio Si:Ge can optionally be changed by varying the gas flow rate and that the optical band gap can also be controlled to form deposited films having desired property.

From the result, it has been found that the optical film quality of the deposited film can be controlled with ease in accordance with the present invention.

EXAMPLE 9

A Si:C:H:F film was formed by the same procedures as those in Example 7 except for setting the $H_2$ gas flow rate to 50 sccm and the microwave charging power to 300 W and under the conditions as described below. A glass substrate (#7059) of 150 φ diameter was used as the substrate, 20 sccm of $Si_2F_6$ gas and 10 sccm of $CH_4$ gas were introduced into the film forming space, the pressure in the film forming space was set to 0.2 Torr and the substrate temperature was set to 260° C. Film was formed for 60 min using the same gas liberation ring, metal mesh member and substrate position as those in Example 1.

Then, film was formed in the same procedures as described above except for adding 10 sccm of $BF_3$ gas diluted with He gas to 10%. $H_\alpha/H_\beta$ ratio upon film formation was 180 in each of the cases (referred to as specimen No. 9-1 and No. 9-2).

Then, the film was formed in the same procedures as those for the specimen 9-2 except for setting the $H_2$ gas flow rate to 100 sccm and the inside pressure to 0.03 Torr (referred to as specimen No. 9-3).

Each of the specimens thus obtained was evaluated for the crystallinity and the H content and, further, thermovoltatic power was measured to judge the conduction type in the same manner as in Example 7. Separately, a portion was cut-out from each of the specimens, which was put into a vacuum deposition chamber and vapor-deposited with a comb-type aluminum gap electrode (gap width 250 μm, width 5 mm). Then, the dark electroconductivity under voltage application of 10 V was measured and, thereafter, photoconductivity was measured under the irradiation of AM-1 light (100 mW/cm²), thereby determining the ratio between the dark electroconductivity and the photoconductivity. Each of the properties was within a range of about ±3% in the entire plane. The results obtained are shown in Table 7.

From the foregoing results it has been found that the conduction type of the deposited film and the electrical property thereof can be controlled with ease in accordance with the present invention.

EXAMPLE 10

Deposited films were formed in the same procedures as those in Example 7 except for changing the microwave charging power from 350 W to 200 W, and eating the activation space 114 constituted with the quartz tube disposed above a gas supply pipe 120 to 700° C. by means of the infrared heating furnace 115 as the activating energy generation means.

Film was formed for the first time by using a #7059 glass as the substrate and setting the $H_2$ gas flow rate to 100 sccm and inner pressure to 0.05 Torr (referred to as specimen No. 10-1). Then, the next film was formed by replacing thesubstrate with a 6 inch n+Si wafer, setting the $H_2$ gas flow rate to 20 sccm, and setting the pressure in the film forming space to 0.01 Torr (referred to as specimen No. 10-2).

When the thus obtained deposited films were evaluated in the same procedures as in Example 7, the deposition rate showed no decrease although the microwave charging power was reduced and substantially the same properties as those in Example 7 were obtained as shown in Table 8.

EXAMPLE 11

Deposited films were formed under the same procedures and film forming conditions as those in Example 7 except for changing the film-forming raw material compound and replacing a portion of the film forming conditions for those shown in Table 9.

When the specimens thus obtained were evaluated in the same procedures as in Example 9, the results as shown in Table 10 were obtained.

EXAMPLE 12

Si:C:H:F films were formed by the same procedures as those in Example 7 except for setting the $H_2$ gas flow rate to 50 sccm and microwave charging power to 200 W and under the conditions as described below.

A gas mixture of $SiF_4$ gas at 20 sccm and $SiH_4$ at 5 sccm was used as the first raw material gas and $CF_4$ gas at a flow rate of 10 sccm was used as the second raw material gas, which were introduced into the film forming space, and the pressure in the film forming space was set to 0.03 Torr and the substrate temperature was set to 200° C. The porosity for the metal mesh member was set to 30% and the gas liberation ring and the substrate position were the same as those in Example 1. The ratio $H_\alpha/H_\beta$ upon film formation was 100 (referred to as specimen No. 12-1 and No. 12-2).

When the obtained specimens were a evaluated in the same procedure as those in Example 9, the results as shown in Table 11 were obtained.

Each of the properties showed a distribution within a range of about ±3% in the plane.

TABLE 2

| Specimen Item | No. 2-1 | No. 2-2 |
|---|---|---|
| Crystallinity | Amorphous | Epitaxial |
| Electrical property | $\sigma p/\sigma d = 4.2 \times 10^5$ | $\mu h = 440\ cm^2/v.sec$ |
| Conduction type | p type | p type |
| H content | 9 atomic % | 0.07 atomic % |

TABLE 3

| Example | Raw material compound and flow rate | Change of film forming condition |
|---|---|---|
| 4 | $GeF_4$ 10 sccm<br>$PF_5$ diluted with He to 500 ppm) 5 sccm<br>$H_2$/Ar 30/150 sccm | Microwave power 250 W<br>$H\alpha/H\beta = 140$<br>Glass substrate: #7059<br>Pressure 0.08 Torr<br>Substrate temperature 180° C. |
| 5 | $GeF_4$/Ge (450° C.) 10 sccm<br>$BF_3$ (diluted with He to 800 ppm) 5 sccm Pressure 0.03 Torr<br>$H_2$/Ar 100/150 sccm | Microwave power 250 W<br>$H\alpha/H\beta = 200$<br>n+Si wafer<br>Substrate temperature 250° C. |
| 6 | $CH_3F$ 15 sccm<br>$H_2$/He 250/50 sccm | Microwave power 350 W<br>$H\alpha/H\beta = 35$<br>Non-doped Si wafer<br>Pressure 0.005 Torr<br>Substrate temperature 300° C. |

TABLE 4

| Example | Film quality | H content | Film property |
|---|---|---|---|
| 4 | amorphous Ge:H:F:P | 21 atomic % | $\mu$ e 1.5 $cm^2/v.sec$ n type |
| 5 | epitaxial Ge:H:F:B | 0.05% atomic % | $\mu$ h 3500 $cm^2/v.sec$ p type |
| 6 | diamond-like C:H:F | 0.08 atomic % | Mohs hardness: greater than 9 |

TABLE 5

| Specimen No. | No. 7-1 | No. 7-2 | No. 7-3 |
|---|---|---|---|
| Film quality | Si:Ge:H:F | Si:Ge:H:F | Si:Ge:H:F |
| Crystallinity | Amorphous | Polycrystalline | Epitaxial |
| H content | 10.5% | 3.5% | 0.5% |
| Hole mobility | 0.8 $cm^2/v.sec$ | 65 $cm^2/v.sec$ | 1200 $cm^2/v.sec$ |
| Conduction type | intrinsic | intrinsic | intrinsic |

TABLE 6

| Specimen No. | No. 8-1 | No. 8-2 | No. 8-3 | No. 8-4 |
|---|---|---|---|---|
| $GeF_4$ flow rate | 5 sccm | 7 sccm | 12 sccm | 15 sccm |
| Si:Ge composition ratio (atomic %) | 86:14 | 79:21 | 70:30 | 61:39 |
| Optical band gap | 1.65 eV | 1.60 eV | 1.53 eV | 1.44 eV |
| $\sigma p/\sigma d$ | $4.0 \times 10^5$ | $9.2 \times 10^4$ | $3.3 \times 10^4$ | $1.8 \times 10^4$ |

TABLE 7

| Specimen No. | No. 9-1 | No. 9-2 | No. 9-3 |
|---|---|---|---|
| Film quality | Si:C:H:F | Si:C:H:F | Si:C:H:F |
| Crystallinity | Amorphous | Amorphous | Polycrystalline |
| H content | 12.5% | 10.8% | 4.5% |
| $\sigma p/\sigma d$ | $5.5 \times 10^4$ | $6.2 \times 10^4$ | $3.9 \times 10^2$ |
| Conduction type | intrinsic | p type | p type |

TABLE 8

| Specimen No. | No. 10-1 | No. 10-2 |
|---|---|---|
| Film quality | Si:Ge:H:F | Si:Ge:H:F |
| Crystallinity | Polycrystalline | Epitaxial |
| H content | 10.5% | 3.5% |
| Hole mobility | 62 $cm^2/v.sec$ | 1220 $cm^2v.sec$ |
| Conduction type | intrinsic | intrinsic |

TABLE 9

| Specimen No. | raw material gas and flow rate | | Film forming condition |
|---|---|---|---|
| 11-1 | $SiF_4$ | 30 sccm | Microwave power 280 W |
| | $C_2H_2$ | 5 sccm | $SiF_4$ activated with RF discharge |
| | $H_2$ | 20 sccm | (10 W) in an activation chamber |

TABLE 9-continued

| Specimen No. | raw material gas and flow rate | | Film forming condition | |
|---|---|---|---|---|
| 11-2 | Ar | 200 sccm | was introduced | |
| | $SiH_2F_2$ | 30 sccm | Microwave power | 200 W |
| | $SnF_4$ | 20 sccm | Pressure | 0.65 Torr |
| | $H_2$ | 40 sccm | | |
| 11-3 | Ar | 200 sccm | | |
| | $SiH_2Cl_2$ | 30 sccm | Microwave power | 280 W |
| | $SnCl_4$ | 10 sccm | Pressure | 0.15 Torr |
| | $H_2$ | 20 sccm | | |
| | Ar | 200 sccm | | |
| | $B_2H_6$ | 10 sccm | | |

TABLE 10

| Specimen No. | No. 11-1 | No. 11-2 | No. 11-3 |
|---|---|---|---|
| Film quality | Si:C:H:F | Si:Sn:H:F | Si:Sn:H:F |
| Crystallinity | Amorphous | Amorphous | Amorphous |
| H content | 9.8% | 7.6% | 8.1% |
| $\sigma p/\sigma d$ | $2.5 \times 10^4$ | $3.8 \times 10^2$ | $2.8 \times 10^2$ |
| Conduction type | intrinsic | intrinsic | p type |

TABLE 11

| Specimen No. | No. 12-1 | No. 12-2 |
|---|---|---|
| Film quality | Si:C:H:F | Si:C:H:F |
| Crystallinity | Polycrystalline | Epitaxial |
| H content | 2.5% | 0.02% |
| $\sigma p/\sigma d$ | $8.5 \times 10^2$ | 3.2 |
| Conduction type | intrinsic | intrinsic |

What we claim is:

1. A process for the formation of a functional deposited film containing atoms belonging to the group IV of the periodical table as the main constituent atoms by introducing, into a film forming space for forming a deposited film on a substrate disposed therein, a compound containing an element belonging to the group IV of the periodical table as the film-forming raw material and, if required, a compound containing an element capable of controlling valence electrons for the deposited film as the constituent element, each in a gaseous state, or in a state where at least one of said compounds is previously activated in an activation space disposed separately from said film forming space, while forming hydrogen atoms in excited state, which cause chemical reaction with at least one of said compounds in the gaseous state or in activated state in an activation space different from said film forming space and introducing them into the film forming space, thereby forming the deposited film on said substrate, wherein said hydrogen atoms in excited state are formed from a hydrogen gas or a gas mixture composed of a hydrogen gas and a rare gas by means of a microwave plasma generated in a plasma generation chamber disposed in a cavity resonator integrated with two impedance matching circuits in a microwave circuit and the excited state of the hydrogen atoms is controlled.

2. A process for the formation of a functional deposited film as defined in claim 1, wherein the excited state of the hydrogen atoms is controlled by measuring the emission intensity of $H_\alpha/H_\beta$ which is the excited state of hydrogen by means of emission spectraphotometry and controlling at least one of the parameters of the microwave power to be charged into the cavity resonator, impedance matching condition, hydrogen gas flow rate or flow rate of the gas mixture of hydrogen gas and rare gas and total pressure so as to attain a desired value for said intensity ratio.

3. A process for the formation of a functional deposited film as defined in claim 1 or 2, wherein the impedance matching circuit in the cavity resonator integrated with the two impedance matching circuits in microwave circuit is restriction means disposed to a cavity length varying plunger or to the junction portion between the microwave guide tube and the cavity resonator, and the impedance matching condition is controlled by adjusting them.

4. A process for the formation of a functional deposited film as defined in claim 3, wherein the impedance matching circuit is the cavity resonance varying plunger and an E-H tuner or a three-stub tuner.

5. A process for the formation of a functional deposited film as defined in claim 1, wherein the plasma forming chamber comprises a metal mesh member and a microwave permeable bell jar and is connected by way of said metal mesh member to said film forming space.

6. A process for the formation of a functional deposited film as defined in claim 5, wherein the hydrogen atoms in the excited state are introduced through the metal mesh member into the film forming space.

7. A process for the formation of a functional deposited film as defined in claim 5, wherein the substrate is disposed at an angle of 30 degree or less relative to the horizontal axis of the metal mesh surface and at a distance within 100 mm from said metal mesh surface, and the compound in the gaseous state or the activated state are introduced from gas liberation means disposed between said metal mesh surface and said substrate into the film forming space.

8. A process for the formation of a functional deposited film as defined in claim 7, wherein the gas liberation means is disposed so as to surround the substrate in an annular manner, the interval of the gas liberation apertures is gradually decreased from the side of introducing the gas to the final liberation aperture of said gas liberation means, so that the gas liberation amount from the respective gas liberation apertures may be unified.

9. A process for the formation of a functional deposited film as defined in claim 7, wherein the gas liberation means is disposed so as to surround the substrate in an annular manner, the diameter for the gas liberation apertures is gradually increased from the side of introducing the gas to the final liberation aperture of said gas liberation means, so that the gas liberation amount from the respective gas liberation apertures may be unified.

10. A process for the formation of a functional deposited film as defined in claim 7, wherein the gas liberation apertures of the gas liberation means are uniformly distributed at least within the plane of the substrate and the aperture diameter for the respective gas liberation apertures is gradually increased from the side of introducing the gas to the central portion of the gas liberation means, so that the gas liberation amount from the respective gas liberation apertures may be unified.

11. A process for the formation of a functional deposited film containing silicon atoms and atoms belonging to the group IV of the periodical table as the main constituent atoms by introducing, into a film forming space for forming a deposited film on a substrate disposed therein, a compound (1) containing silicon and a compound (2) represented by the following general formula (I) as the film-forming raw material and, if required, a compound (3) containing an element capable of controlling valence electrons for the deposited film as the constituent element each in a gaseous state, or in a state where at least one of such compounds is previously activated in an activation space disposed separately from said film forming space, while forming hydrogen atoms in excited state which cause chemical reaction with at least one of said compounds (1), (2) and (3) in the gaseous state or in the activated state in an activation space different from said film forming space and introducing them into the film-forming space, thereby forming the deposited film on said substrate, wherein said hydrogen atoms in excited state are formed from a hydrogen gas or a gas mixture composed of a hydrogen gas and a rare gas by means of a microwave plasma generated in a plasma generation chamber disposed in a cavity resonator integrated with two impedance matching circuits in a microwave circuit and the excited state of the hydrogen atoms is controlled:

$$A_aB_b \qquad (I)$$

where A represents an element among those elements other than silicon belonging to the group IV of the periodical table, B represents a member selected from hydrogen (H), halogen (X) and hydrocarbon group, a represents a positive integer equal to or multiple integer of the valence number for B and b represents a positive integer.

12. A process for the formation of a functional deposited film as defined in claim 11, wherein the excited state of the hydrogen atoms is controlled by measuring the emission intensity of $H_{60}/H_{62}$ which is the excited state of hydrogen by means of emission spectraphotometry and controlling at least one of the parameters comprising microwave power to be charged into the cavity resonator, impedance matching condition, hydrogen gas flow rate or flow rate ratio of the gas mixture of the hydrogen gas and the rare gas and entire pressure so as to attain a desired value for said intensity ratio.

13. A process for the formation of a functional deposited film as defined in claim 11 or 12, wherein the impedance matching circuit in the cavity resonator integrated with the two impedance matching circuits in the microwave circuit is restriction means disposed to a cavity length varying plunger or to the junction portion between the microwave guide tube and the cavity resonator, and the impedance matching condition is controlled by adjusting them.

14. A process for the formation of a functional deposited film as defined in claim 13, wherein the impedance matching circuit is the cavity resonance varying plunger and an E-H tuner or a three-stub tuner.

15. A process for the formation of a functional deposited film as defined in claim 11, wherein the plasma generation chamber comprises a metal mesh member and a microwave permeable bell jar and is connected by way of said metal mesh member to said film forming space.

16. A process for the formation of a functional deposited film as defined in claim 15, wherein the hydrogen atoms in the excited state are introduced through the metal mesh member into the film forming space.

17. A process for the formation of a functional deposited film as defined in claim 15, wherein the substrate is disposed at an angle of 30 degree or less relative to the horizontal axis of the metal mesh surface and at a distance within 100 mm from said metal mesh surface, and the compound (1), (2) and (3) in the gaseous state or the activated state are introduced from the gas liberation means disposed between said metal mesh surface and said substrate into the film forming space.

18. A process for the formation of a functional deposited film as defined in claim 17, wherein the gas liberation means are disposed so as to surround the substrate in an annular manner, the interval of the gas liberation apertures is gradually decreased from the side of introducing the gas to the final liberation aperture of said gas liberation means, so that the gas liberation amount from the respective gasiberation apertures may be unified.

19. A process for the formation of a functional deposited film as defined in claim 17, wherein the gas liberation means is disposed so as to surround the substrate in an annular manner, the diameter for the gas liberation apertures is gradually increased from the side of introducing the gas to the final liberation aperture of said gas liberation means, so that the gas liberation amount from the respective gas liberation apertures may be unified.

20. A process for the formation of a functional deposited film as defined in claim 17, wherein the gas liberation apertures of the gas liberation means are uniformly distributed at least within the plane of the substrate and the aperture diameter for the respective gas liberation apertures is gradually increased from the side of introducing the gas to the central portion of the gas liberation means, so that the gas liberation amount from the respective gas liberation apertures may be unified.

* * * * *

UNITED STATES PATENT AND TRADEMARK OFFICE
CERTIFICATE OF CORRECTION

PATENT NO. : 4,908,330
DATED : March 13, 1990
INVENTOR(S) : TAKAYOSHI ARAI, ET AL.

It is certified that error appears in the above-identified patent and that said Letters Patent is hereby corrected as shown below:

COLUMN 1

Line 51, "sometime" should read --sometimes--.
Line 54, "time" should read --times--.

COLUMN 2

Line 35, "diversed" should read --diverted--.

COLUMN 4

Line 39, "micrwwave" should read --microwave--.

COLUMN 5

Line 12, "b" should read --by--.
Line 26, "restrictions" should read --restriction--.

COLUMN 6

Line 45, "take place" should read --cause a--.
Line 53, "dessociating" should read --dissociating--.

COLUMN 7

Line 24, "intergerof" should read --integer of--.

UNITED STATES PATENT AND TRADEMARK OFFICE
CERTIFICATE OF CORRECTION

PATENT NO. : 4,908,330
DATED : March 13, 1990
INVENTOR(S) : TAKAYOSHI ARAI, ET AL.

It is certified that error appears in the above-identified patent and that said Letters Patent is hereby corrected as shown below:

COLUMN 8

Line 28, "taking place" should read --which cause--.
Line 39, "causing" should read --to cause--.
Line 47, "followings." should read --following.--.
Line 67, "etc" should read --etc.--.

COLUMN 9

Line 14, "$Ge_uH_xY_{rpl}$," should read --$Ge_uH_xY_y$,--.
Line 30, "$C_4H_6$" should read --$C_4H_6$:--.
Line 31, "halides" should read --halide--.
Line 42, "$BnBr_4$," should read --$SnBr_4$,--.

COLUMN 10

Line 10, "$As(CH_3)_3$," should be deleted.
Line 13, "foregoings," should read --foregoing,--.
Line 16, "be" should read --may be--.
Line 45, "compound" should read --compounds--.

COLUMN 11

Line 28, "plasma forming chamber 703" should read --plasma generation chamber 703--.

COLUMN 12

Line 32, "in" should be deleted.
Line 55, "at" should read --with--.

UNITED STATES PATENT AND TRADEMARK OFFICE
CERTIFICATE OF CORRECTION

PATENT NO. : 4,908,330

DATED : March 13, 1990

INVENTOR(S) : TAKAYOSHI ARAI, ET AL.

It is certified that error appears in the above-identified patent and that said Letters Patent is hereby corrected as shown below:

COLUMN 13

Line 24, "comprising" should read --comprises--.
    Line 25, "prising" should read --prises--.
    Line 41, "comprising" should read --comprises--.
    Line 42, "prising" should read --prises--.
    Line 61, "FIG. 4(1) and (2)," should read --FIGS. 4(1) and (2),--.
    Line 65, "30 degree" should read --30 degrees--.

COLUMN 14

TABLE 1(2), "equi distance)" should read --(equi distance)--.
    Line 54, "30 degree" should read --30 degrees--.
    Line 55, "degree" should read --degrees--.

COLUMN 15

Line 5, "apertures size" should read --aperture size--.
    Line 8, "FIG. 5(1), (2)" should read --FIGS. 5(1), (2)--

COLUMN 17

Line 19, "left" should read --left of--.
    Line 21, "slindingly" should read --slidingly--.
    Line 52, "stated" should read --state--.
    Line 61, "monitor" should read --monitoring--.
    Line 67, "monitor" should read --monitoring--.

UNITED STATES PATENT AND TRADEMARK OFFICE
CERTIFICATE OF CORRECTION

PATENT NO. : 4,908,330
DATED : March 13, 1990
INVENTOR(S) : TAKAYOSHI ARAI, ET AL.

It is certified that error appears in the above-identified patent and that said Letters Patent is hereby corrected as shown below:

COLUMN 18

Line 12, "Coning Glass" should read --Corning Glass--.
Line 14, "film forming space 16," should read
--film forming space 116,--.
Line 31, "is" should read --was--.
Line 41, "reflection power-incident" should read
--reflection power/incident--.
Line 45, "A" should read --At--.
Line 46, "$H_{60}/H_\beta$" should read --$H_\alpha/H_\beta$--.

COLUMN 19

Line 13, "diffractiometry" should read
--diffractometry-- and "diffractiome-"
should read --diffractome- --
Line 25, "photoconductivty" should read
--photoconductivity--.
Line 33, "thermovoltatic" should read --thermovoltaic--.
Line 38, "foregoings," should read --foregoing,--.
Line 51, "$H_{60}/H_{62}$" should read --$H_\alpha/H_\beta$--.
Line 66, "Coning Glass Works)" should read
--Corning Glass Works)--.

COLUMN 20

Line 3, "diffracti-" should read --diffract- --.
Line 4, "diffractiometry" should read
--diffractometry--.
Line 10, "evacuated," should read --measured,--.
Line 20, "ite" should read --ited--.

UNITED STATES PATENT AND TRADEMARK OFFICE
CERTIFICATE OF CORRECTION

PATENT NO. : 4,908,330

DATED : March 13, 1990

INVENTOR(S) : TAKAYOSHI ARAI, ET AL.

It is certified that error appears in the above-identified patent and that said Letters Patent is hereby corrected as shown below:

COLUMN 20

Line 27, "Coning Glass Works)" should read --Corning Glass Works)--.

Line 46, "is" should read --was--.

COLUMN 21

Line 7, "reservoirs" should read --reservoir--.

Line 15, "7.5 um" should read --7.5 µm--.

Line 24, "$H_{60}/H_\beta$" should read --$H_\alpha/H_\beta$--.

Line 28, "diffractiometry" should read --diffractometry-- and "diffractiome-" should read --diffractome- --.

Line 31, "specimen No. 7-1" should read --specimen No. 7-2--.

Line 65, "diffractiome-" should read --diffractome- --.

Line 66, "diffractiometry" should read --diffractometry--.

COLUMN 22

Line 20, "desired" should read --a desired--.

Line 50, "thermovoltatic" should read --thermovoltaic--.

Line 52, "cut-out" should read --cut out--.

COLUMN 23

Line 5, "eating" should read --heating--.

Line 14, "thesubstrate" should read --the substrate--.

Line 53, "a" should be deleted.

UNITED STATES PATENT AND TRADEMARK OFFICE
CERTIFICATE OF CORRECTION

PATENT NO. : 4,908,330
DATED : March 13, 1990
INVENTOR(S) : TAKAYOSHI ARAI, ET AL.

It is certified that error appears in the above-identified patent and that said Letters Patent is hereby corrected as shown below:

COLUMN 24

TABLE 3, "$PF_5$ diluted" should read --$PF_5$ (diluted--.
    TABLE 3, "5 sccm Pressure 0.03 Torr" should read
        --5sccm                       Pressure 0.03 Torr--

TABLE 4, "0.05%" should read --0.05--.
    TABLE 8, "1220 $cm^2$v.sec" should read --1220 $cm^2$/v.sec--.

COLUMN 26

Line 25, "30 degree" should read --30 degrees--.
    Line 29, "are" should read --is--.
    Line 59, "periodical table" should read
        --periodic table--.

COLUMN 27

Line 21, "periodical table," should read
        --periodic table,--.
    Line 29, "$H_{60}/H_{62}$" should read --$H_\alpha/H_\beta$--.

UNITED STATES PATENT AND TRADEMARK OFFICE
CERTIFICATE OF CORRECTION

PATENT NO. : 4,908,330

DATED : March 13, 1990

INVENTOR(S) : TAKAYOSHI ARAI, ET AL.

It is certified that error appears in the above-identified patent and that said Letters Patent is hereby corrected as shown below:

COLUMN 28

Line 15, "30 degree" should read --30 degrees--.
    Line 18, "compound (1), (2) and (3)" should read --compounds (1), (2) and (3)--.
    Line 29, "gasiberation" should read --gas liberation--.

Signed and Sealed this

Seventh Day of January, 1992

Attest:

HARRY F. MANBECK, JR.

Attesting Officer    Commissioner of Patents and Trademarks